(12) United States Patent
Takahashi et al.

(10) Patent No.: US 10,840,470 B2
(45) Date of Patent: Nov. 17, 2020

(54) ORGANIC LIGHT EMITTING ELEMENT, DISPLAY APPARATUS, IMAGE PICKUP APPARATUS, AND ILLUMINATION APPARATUS

(71) Applicant: CANON KABUSHIKI KAISHA, Tokyo (JP)

(72) Inventors: Tetsuo Takahashi, Kawasaki (JP); Satoru Shiobara, Hiratsuka (JP); Koichi Ishige, Yokohama (JP); Tomona Yamaguchi, Tokyo (JP); Koji Ishizuya, Fujisawa (JP); Takayuki Ito, Kawasaki (JP); Norifumi Kajimoto, Zama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/368,675

(22) Filed: Mar. 28, 2019

(65) Prior Publication Data
US 2019/0305242 A1 Oct. 3, 2019

(30) Foreign Application Priority Data

Mar. 30, 2018 (JP) .................. 2018-068577
Nov. 8, 2018 (JP) .................. 2018-210725

(51) Int. Cl.
| | |
|---|---|
| *H01L 51/50* | (2006.01) |
| *H04N 5/232* | (2006.01) |
| *H01L 27/32* | (2006.01) |

(52) U.S. Cl.
CPC ...... *H01L 51/5012* (2013.01); *H01L 27/3244* (2013.01); *H01L 51/502* (2013.01);
(Continued)

(58) Field of Classification Search
CPC . H01L 27/32; H01L 27/3225; H01L 27/3227; H01L 27/3232; H01L 27/3234;
(Continued)

(56) References Cited

U.S. PATENT DOCUMENTS

2010/0053041 A1* 3/2010 Abe .................. G09G 3/325
345/76
2012/0256535 A1 10/2012 Seo
(Continued)

FOREIGN PATENT DOCUMENTS

| JP | H09-241629 A | 9/1997 |
|---|---|---|
| JP | H10-330295 A | 12/1998 |

(Continued)

OTHER PUBLICATIONS

X.Y. Zheng et al.; A White OLED based on DPVBi blue light emitting host and DCJTB red dopant; Displays; Oct. 2003; vol. 24, Issue 3, pp. 121-124.
(Continued)

*Primary Examiner* — Eduardo A Rodela
(74) *Attorney, Agent, or Firm* — Canon U.S.A., Inc. IP Division

(57) ABSTRACT

One embodiment of this invention has a first electrode, a first light emitting layer, and a second electrode, in which the first light emitting layer has a first host material and a first dopant material, a lowest triplet excitation energy of the first host material is higher than a lowest triplet excitation energy of the first dopant material, and, when a weight of the first light emitting layer is set to 100 wt %, a concentration of the first dopant material is 0.3 wt % or less.

20 Claims, 10 Drawing Sheets

(52) U.S. Cl.
CPC ........ H01L 51/5004 (2013.01); H01L 51/504 (2013.01); H01L 51/5044 (2013.01); H04N 5/23293 (2013.01)

(58) Field of Classification Search
CPC ............ H01L 51/5012; H01L 51/5016; H01L 51/502; H01L 51/5024
See application file for complete search history.

(56) References Cited

U.S. PATENT DOCUMENTS

| | | | |
|---|---|---|---|
| 2016/0093823 A1 | 3/2016 | Seo | |
| 2016/0343954 A1 | 11/2016 | Seo | |
| 2017/0092870 A1* | 3/2017 | Kim | .................... H01L 51/5072 |
| 2018/0226014 A1* | 8/2018 | Komanduri | ........... G02B 6/0051 |
| 2019/0241519 A1* | 8/2019 | Fuchiwaki | ............ C07D 209/88 |
| 2019/0256538 A1* | 8/2019 | Hatakeyama | ........... C09K 11/06 |
| 2019/0372048 A1* | 12/2019 | Cheng | ................. H01L 27/3244 |
| 2020/0081294 A1* | 3/2020 | You | .................... G02F 1/133606 |

FOREIGN PATENT DOCUMENTS

| | | |
|---|---|---|
| JP | 2004-134397 A | 4/2004 |
| JP | 2006176493 A | 7/2006 |
| JP | 2007063285 A | 3/2007 |
| JP | 2008255095 A | 10/2008 |
| JP | 2008270557 A | 11/2008 |
| JP | 2008297535 A | 12/2008 |
| JP | 2009221180 A | 10/2009 |
| JP | 2010143879 A | 7/2010 |
| JP | 2011011994 A | 1/2011 |
| JP | 2011-192829 A | 9/2011 |
| JP | 2011216640 A | 10/2011 |
| JP | 2011249754 A | 12/2011 |
| JP | 2011256113 A | 12/2011 |
| JP | 2012001514 A | 1/2012 |
| JP | 2012102024 A | 5/2012 |
| JP | 2012149012 A | 8/2012 |
| JP | 2012246258 A | 12/2012 |
| JP | 2013043846 A | 3/2013 |
| JP | 2013049663 A | 3/2013 |
| JP | 2013067586 A | 4/2013 |
| JP | 5241053 B2 | 7/2013 |
| JP | 2013139426 A | 7/2013 |
| JP | 2014022205 A | 2/2014 |
| WO | 2005040302 A1 | 5/2005 |
| WO | 2017/025839 A1 | 2/2017 |

OTHER PUBLICATIONS

Su, Zisheng, et al, "Triplet to singlet transition induced low efficiency roll-off in green phosphorescent organic light-emitting diodes", Thin Solid Films, vol. 519, 2011, pp. 2540-2543.

Gross, E. M. et al.,"Electrogenerated Chemiluminescence from Derivatives of Aluminum Quinolate and Quinacridones: Cross-Reactions with Triarylamines Lead to Singlet Emission through Triplet-Triplet Annihilation Pathways", J. Am. Chem. Soc., vol. 122, 2000, pp. 4972-4979.

* cited by examiner

ORGANIC LIGHT EMITTING ELEMENT, DISPLAY APPARATUS, IMAGE PICKUP APPARATUS, AND ILLUMINATION APPARATUS

BACKGROUND OF THE INVENTION

Field of the Invention

The present invention relates to an organic light emitting element, a display apparatus, an image pickup apparatus, and an illumination apparatus.

Description of the Related Art

An organic light emitting element is driven by disposing a thin film containing a light emitting organic compound between an anode and a cathode, applying a voltage between the electrodes, and injecting holes and electrons. Light emitted when the holes and the electrons are recombined within the element, so that an excitation state (exciton) of the organic compound returns to a ground state is utilized.

Recent progress in the organic light emitting element is remarkable. The organic light emitting element has characteristics of high luminance at a low applied voltage, diversity in emission wavelength, high-speed responsivity, and feasibility of the production of a thin and lightweight light emitting device, and therefore a development of wide applications thereof has been performed.

A full color display using the organic light emitting element is known. Examples of systems include a system of separately forming a light emitting layer for each pixel (element) to thereby emit light of different emission colors, a system of providing light emitting layers emitting white color, and extracting different emission colors for each pixel using a color filter, and the like. With respect to the white light emitting layers, it is known to use two or more kinds of light emitting materials and two or more light emitting layers.

Japanese Patent Laid-Open No. 2014-022205 (hereinafter referred to as Patent Document 1) describes an organic light emitting element in which two light emitting layers are laminated on each other and which has a blue light emitting dopant in the light emitting layer on a cathode side and 0.5 wt % red light emitting dopant and a green light emitting dopant in the light emitting layer on an anode side.

Japanese Patent Laid-Open No. 2008-270557 (hereinafter referred to as Patent Document 2) describes an organic light emitting element having 0.3 wt % light blue light emitting dopant and 0.3 wt % yellow light emitting dopant in one light emitting layer.

In the organic light emitting element of Patent Document 1, the concentration of the red light emitting dopant is high, and therefore inactivation of excitons in the dopant is likely to occur, and thus a further improvement in emission efficiency has been demanded.

In the organic light emitting element of Patent Document 2, the light blue light emitting dopant and the yellow light emitting dopant are contained in the same layer, and therefore excitons are likely to be trapped by the yellow light emitting dopant present in the same layer as the layer where the light blue light emitting dopant is present. Therefore, the concentration of excitons present in the layer of the light blue light emitting dopant does not become relatively low, and thus material deterioration is likely to occur and a sufficient continuous drive lifetime in practical use has not been able to achieve.

SUMMARY OF THE INVENTION

It is an object of the present invention to provide an organic light emitting element having high emission efficiency and a long drive lifetime.

One embodiment of the present invention is an organic light emitting element including a first electrode, a first light emitting layer, and a second electrode, in which the first light emitting layer includes a first host material and a first dopant material, the lowest triplet excitation energy of the first host material is higher than the lowest triplet excitation energy of the first dopant material and, when the weight of the first light emitting layer is set to 100 wt %, the concentration of the first dopant material is 0.3 wt % or less.

Further features of the present invention will become apparent from the following description of exemplary embodiments with reference to the attached drawings. Each of the embodiments of the present invention described below can be implemented solely or as a combination of a plurality of the embodiments or features thereof where necessary or where the combination of elements or features from individual embodiments in a single embodiment is beneficial.

DESCRIPTION OF THE EMBODIMENTS

An organic light emitting element according to one embodiment of the present invention has a first electrode, a first light emitting layer, and a second electrode in this order, in which the first light emitting layer has a first host material and a first dopant material, the lowest triplet excitation energy of the first host material is higher than the lowest triplet excitation energy of the first dopant material and, when the weight of the first light emitting layer is set to 100 wt %, the concentration of the first dopant material is 0.3 wt % or less.

When the lowest triplet excitation energy of the first dopant material is lower than the lowest triplet excitation energy of the host material, the lifetime of the organic light emitting element tends to be prolonged, but an effect of an improvement of the emission efficiency by Triplet-Triplet Annihilation (hereinafter referred to as TTA) is low.

In this embodiment, when the lowest triplet excitation energy of the first dopant material is lower than the lowest triplet excitation energy of the host material, the lowest triplet excitation energy to be trapped by the first dopant material is controlled by the concentration of the first dopant material. Thus, both a long lifetime of the organic light emitting element and an improvement of the emission efficiency by the TTA can be achieved.

In this embodiment, the appropriate setting of the weight ratio of the first dopant material in the first light emitting layer leads to an increase in the TTA efficiency. The TTA is a generation phenomenon of a singlet exciton by collision of two triplet excitons. In order to obtain an organic light emitting element having high emission efficiency in an organic light emitting element emitting fluorescence, the emission by the TTA may be efficiently produced. The TTA occurs due to the collision of the triplet excitons in the host material serving as the main component in the light emitting layer. However, when the lowest triplet excitation energy of the dopant material is lower than the lowest triplet excitation energy of the host material, the lowest triplet excitation energy is likely to be trapped by the dopant material, and therefore the occurrence of the TTA in the host material may be blocked.

It is found that, when the weight ratio of the first dopant material is 0.3 wt % or less, triplet excitons which are not trapped by the first dopant material are moderately generated, and, as a result, the TTA is efficiently caused to occur. When the weight ratio of the first dopant material is larger than 0.3 wt %, the probability that the triplet excitons are trapped by the first dopant material remarkably increases, so that the TTA efficiency decreases.

Figure 1A:
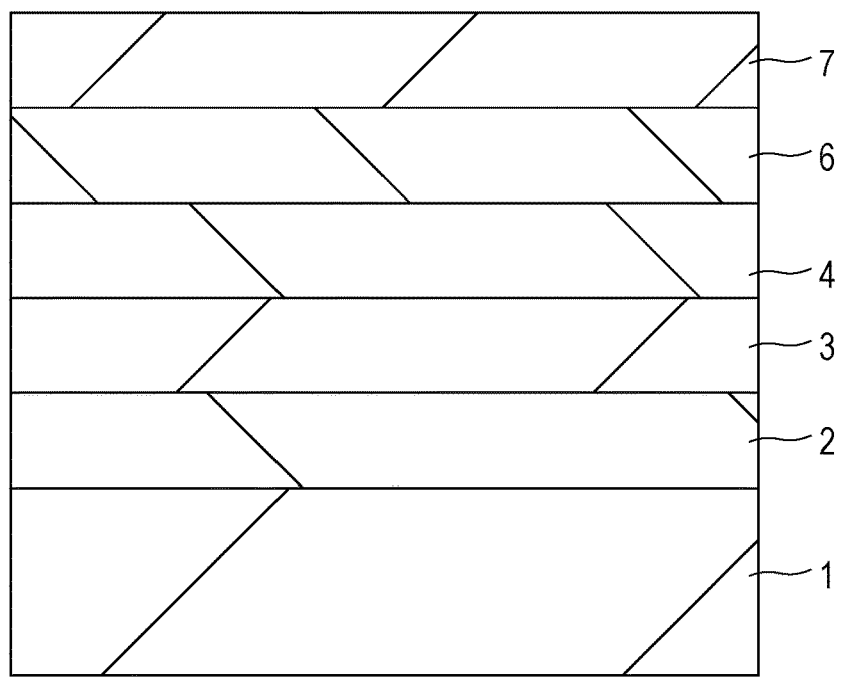
FIGS. 1A and 1B are schematic cross-sectional views illustrating one embodiment of the present invention.
Figure 1B:
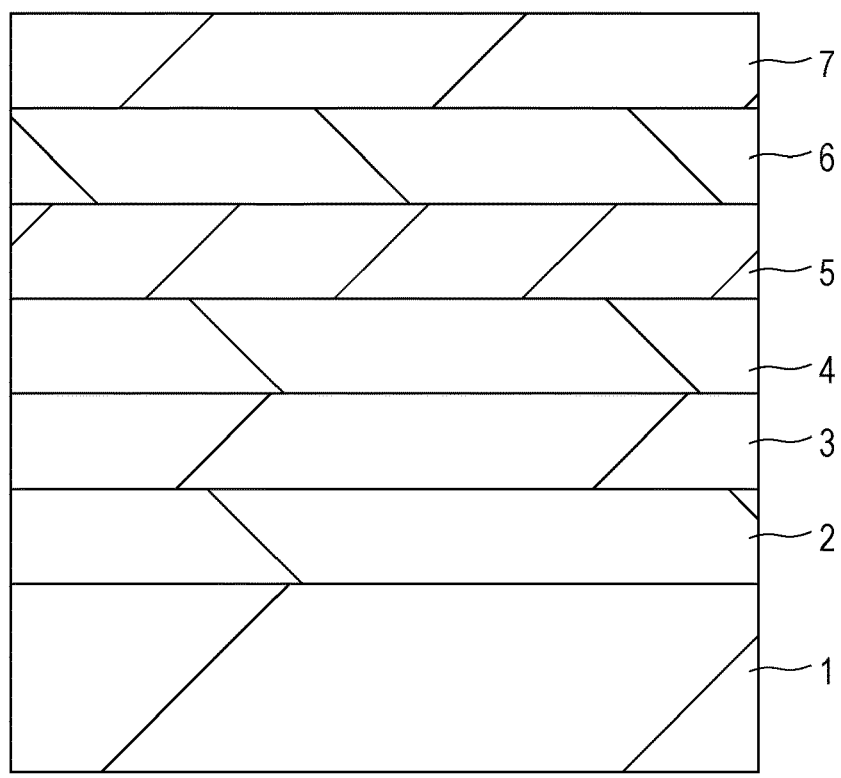

FIGS. 1A and 1B are cross-sectional schematic views illustrating one embodiment of the present invention. FIG. 1A has an anode 2, a hole transport layer 3, a first light emitting layer 4, an electron transport layer 6, and a cathode 7 on a substrate 1 in this order from the substrate 1 side. The first light emitting layer 4 has a first dopant. When the weight of the first light emitting layer 4 is set to 100 wt %, the weight ratio thereof is 0.3 wt % or less.

FIG. 1B has the anode 2, the hole transport layer 3, the first light emitting layer 4, a second light emitting layer 5, the electron transport layer 6, and the cathode 7 on the substrate 1 in this order from the substrate 1 side. A first electrode may be an anode or may be a cathode. The first light emitting layer 4 and the second light emitting layer 5 individually have dopants of different emission colors. The present invention is not limited to the configurations described above and may have a hole injection layer, an electron blocking layer, a hole blocking layer, and an electron injection layer. The hole injection layer may be disposed between the anode 2 and the hole transport layer 3.

The electron blocking layer may be disposed between the hole transport layer 3 and the second light emitting layer 5.

The hole blocking layer may be disposed between the first light emitting layer 4 and the electron transport layer 6. The electron injection layer may be disposed between the electron transport layer 6 and the cathode 7. The hole injection layer, the electron blocking layer, the hole blocking layer, and the electron injection layer are used as appropriate as necessary in the present invention.

The energy of an organic compound layer is determined by a material occupying most of the weight ratio thereof. In the case of one material, the energy is determined by the physical property of the material. In the case of a plurality of materials, the energy is determined by the physical property of the material having the largest weight ratio. When the weight ratio is 1:1, an average value of the physical properties of the materials may determine the energy.

In the organic light emitting element according to this embodiment, the first light emitting layer 4 is a light emitting layer having the first host material and the first dopant material. The second light emitting layer 5 is a light emitting layer having a second host material and a second dopant material. The first light emitting layer 4 and the second light emitting layer 5 may be in contact with each other.

In the organic light emitting element according to this embodiment, the first host material is a material having the largest weight ratio in the first light emitting layer 4. The second host material is a material having the largest weight ratio in the second light emitting layer 5. The host material can be said to be a material of a substrate of the first and second light emitting layers 4 and 5.

The first dopant material may be a material having an energy gap smaller than that of the second dopant material. More specifically, the emission wavelength of the first dopant material is longer than the emission wavelength of the second dopant material.

In the organic light emitting element according to this embodiment, the first dopant material may be a light emitting material emitting light of the longest wavelength in the first light emitting layer 4. The second dopant material may be a light emitting material emitting light having the shortest wavelength light in the second light emitting layer 5. In this case, the second light emitting layer 5 emitting light of a short wavelength is likely to deteriorate, and therefore the lowest triplet excitation energy of the second dopant may be higher than the lowest triplet excitation energy of the first dopant. The density of the triplet excitons of the second light emitting layer 5 is reduced and the triplet excitons are caused to stay in the first light emitting layer 4, and therefore the element lifetime can be prolonged. The light emitting material is a material emitting light. The first dopant material and the second dopant material may be light emitting materials. A comparison of the length of the emission wavelengths of the light emitting materials may be performed using the wavelength of the peak having the highest intensity in the emission spectra of the light emitting materials.

The light emitting material of the organic light emitting element according to this embodiment may be a light emitting material emitting fluorescence. This is because singlet excitons generated from the triplet excitons are caused to emit light by the TTA.

A difference between the lowest triplet excitation energy T1(H1) of the first host material and the lowest triplet excitation energy T1(D1) of the first dopant material may be 0.3 eV or less. When the difference is 0.3 eV or less, the lowest triplet excitation energy to be trapped by the first dopant material decreases, and therefore the lowest triplet excitation energy is likely to present in the first host material. As a result, the TTA efficiency desirably improves.

On the other hand, in the organic light emitting element according to this embodiment, the lowest triplet excitation energy T1(H1) of the first host material and the lowest triplet excitation energy T1(D1) of the first dopant material may satisfy the relationship of the following expression (1).

$$T1(H1)-T1(D1) \geq 0.3 \text{ eV} \qquad (1)$$

More specifically, the difference between the lowest triplet excitation energy of the first host material and the lowest triplet excitation energy of the first dopant material may be 0.3 eV or more. This produces an effect that the element lifetime of the organic light emitting element is long. Since the second light emitting layer 5 having a dopant emitting light of a wavelength shorter than that of the first light emitting layer 4 is more likely to cause material deterioration than the first light emitting layer 4, the density of the triplet excitons may be reduced. By establishing the energy relationship of Expression (1), the triplet excitons can be caused to stay in the first light emitting layer 4 and the triplet exciton density of the second light emitting layer 5 can be reduced.

The organic light emitting element according to this embodiment may be an organic white light emitting element having a red light emitting material, a green light emitting material, and a blue light emitting material. In this case, the red light emitting material may be the first dopant material and the blue light emitting material may be the second dopant material. The organic light emitting element according to this embodiment may be an organic white light emitting element having two kinds of light emitting materials in a complementary color relationship. For example, a yellow light emitting material is the first dopant material and a light blue light emitting material is the second dopant material.

Figure 2:
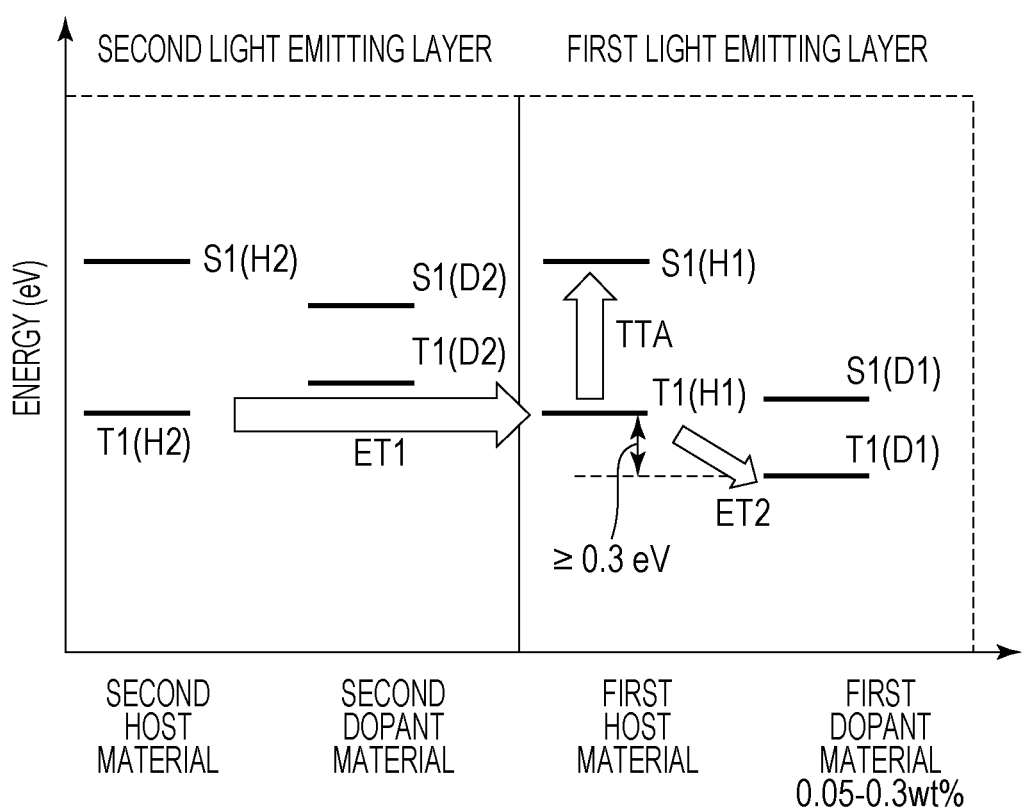
FIG. 2 is a schematic view explaining one embodiment of the present invention.

FIG. 2 is a figure illustrating the triplet exciton energy transfer in the first light emitting layer and the second light emitting layer of the organic light emitting element according to this embodiment. The triplet exciton energy transfer from the first host material to the second dopant material is illustrated. Hereinafter, the triplet exciton energy, the triplet exciton, and the like are referred to but indicate the same thing.

The triplet excitons move in the light emitting layer while repeating the Dexter type energy transfer between adjacent molecules, and therefore cannot move between dopant materials discretely disposed in the light emitting layer. Therefore, the triplet excitons move in the host material.

In FIG. 2, the triplet excitons generated in the second host material move to the first host material to be divided into one which becomes a singlet exciton through the TTA (TTA in FIG. 2) and one which moves to the first dopant material (ET2 in FIG. 2). In this embodiment, the weight ratio of the first dopant material is 0.3 wt % or less and the number of the triplet excitons moving to the first dopant material is small, and therefore the ET2 amount decreases, so that the number of those which become singlet excitons through the TTA can be increased. More specifically, the emission efficiency of the first light emitting layer can be increased.

When the light emitting layer in the organic light emitting element is only the first light emitting layer 4, an improvement of the emission efficiency can be obtained by adjusting the weight ratio of the first dopant material.

The first dopant material of the organic light emitting element according to this embodiment may be a fluorescent light emitting material. This is because, when a phosphorescent light emitting material is used, the triplet excitons of the dopant material are consumed by emission or the like, so that the ET2 in FIG. 2 increases. When the triplet excitons are consumed by emission, the amount that the triplet excitons in the host material move to the dopant material, i.e., ET2, increases. As a result, the triplet excitons in the host material decrease, so that the number of the triplet excitons contributing to the TTA decreases. Therefore, in order to improve the emission efficiency of the first light emitting layer 4, the first dopant material may be a fluorescent light emitting material.

The fact that the organic light emitting element having a fluorescent light emitting material has an element lifetime longer than that of the organic light emitting element having a phosphorescent light emitting material is also a reason why the first dopant material may be a fluorescent light emitting material. It is desirable that all the light emitting materials in the light emitting layer are fluorescent light emitting materials.

On the other hand, when the light emitting layer includes the first light emitting layer 4 and the second light emitting layer 5, it may be configured so that the triplet excitons easily move from the second host material to the first host material. When there is no energy barrier from the second host material to the first host material, the triplet excitons can smoothly move from the second host material to the first host material as illustrated in the ET1 of FIG. 2. Therefore, it is desirable that there is no energy barrier in a path from the second light emitting layer 5 to the first light emitting layer 4.

The energy barrier refers to a state where an energy state of the triplet excitons to move is higher than that before movement. As the configuration that the organic light emitting element has the energy barrier, a case where a layer having the lowest triplet excitation energy higher than that of the second light emitting layer is present is mentioned. Examples of the energy barrier of the triplet exciton energy from the second light emitting layer 5 include an intermediate layer disposed between the first light emitting layer 4 and the second light emitting layer 5. An energy barrier may be present when the energy barrier is small, e.g., less than 0.3 eV.

It is desirable that there is no energy barrier. Specifically, this makes it easy for the triplet excitons to more smoothly move from the second host material to the first host material. More specifically, in the organic light emitting element according to this embodiment, the lowest triplet excitation energy of a material as the main component of each layer contained in a region from the first light emitting layer 4 to the second light emitting layer 5 may be equal to or less than the lowest triplet excitation energy of a material as the main component of a layer adjacent to the second electrode side of each layer. The material as the main component of the organic compound layer is a material having the largest weight ratio in the organic compound layer and is a host material when the organic compound layer is a light emitting layer. When the weight ratio of the materials of the organic compound layer is 1:1, an average value of the lowest triplet excitation energies of the materials is defined as the lowest triplet excitation energy of the organic compound layer. Thus, the movement of the triplet excitons from the second light emitting layer 5 to the first light emitting layer 4 is smoothly performed, and therefore a long continuous drive lifetime can be achieved.

In the organic light emitting element according to this embodiment, the lowest triplet excitation energy of the second host material may by higher than the lowest triplet excitation energy of the first host material. Thus, the triplet excitons moving from the second host material to the first host material serve as an energy barrier when returning to the second host material. Therefore, the triplet exciton density of the second light emitting layer 5 is likely to decrease, and thus a long continuous drive lifetime can be achieved.

In the organic light emitting element according to this embodiment, the first light emitting layer 4 and the second light emitting layer 5 may be in contact with each other. Thus, the triplet excitons can be smoothly moved from the second light emitting layer 5 to the first light emitting layer 4, so that a long continuous drive lifetime can be achieved.

In the organic light emitting element according to this embodiment, the first host material and the second host material may be the same material. This is because the movement efficiency of the triplet excitons between the same materials is excellent as compared with the movement efficiency of the triplet excitons between different kinds of materials. By smoothly moving the triplet excitons from the second light emitting layer 5 to the first light emitting layer 4, a long continuous drive lifetime can be achieved.

The organic light emitting element according to this embodiment may have an energy transfer path of the lowest excitation triplet excitons in a direction from the second electrode to the first electrode. This means that the lowest triplet excitation energy of the second light emitting layer 5 easily reaches the first dopant material by the energy transfer. In other words, it may be said that there is no energy barrier of the lowest excitation triplet exciton from the second light emitting layer 5 to the first dopant material.

When moving from the second light emitting layer 5 to the first dopant material. i.e., in a case where the energy after movement is high, an energy barrier may be present insofar as the energy barrier is within 0.3 eV. A small energy barrier within 0.3 eV does not greatly block the energy transfer.

In the region from the second light emitting layer 5 to the first light emitting layer 4, the first dopant material may be an organic compound in which the lowest triplet excitation energy is the lowest. This is because the efficiency of the energy transfer is higher than that in a case where an organic compound having the lowest triplet excitation energy higher than that of the first dopant material is present.

Even in the case where an energy barrier of less than 0.3 eV is present, it may be said that an energy path is present.

The first light emitting layer 4 and the second light emitting layer 5 may be in contact with each other or other layers may be disposed therebetween. As the other layers, the intermediate layer of the light emitting layers, a layer referred to as an energy transfer inhibitory layer, and the like are mentioned. Even in the case where the energy transfer inhibitory layer and the like are present, the layers may be configured so that the lowest triplet excitation energy can move from the second light emitting layer 5 to the first dopant material.

Figure 3A:
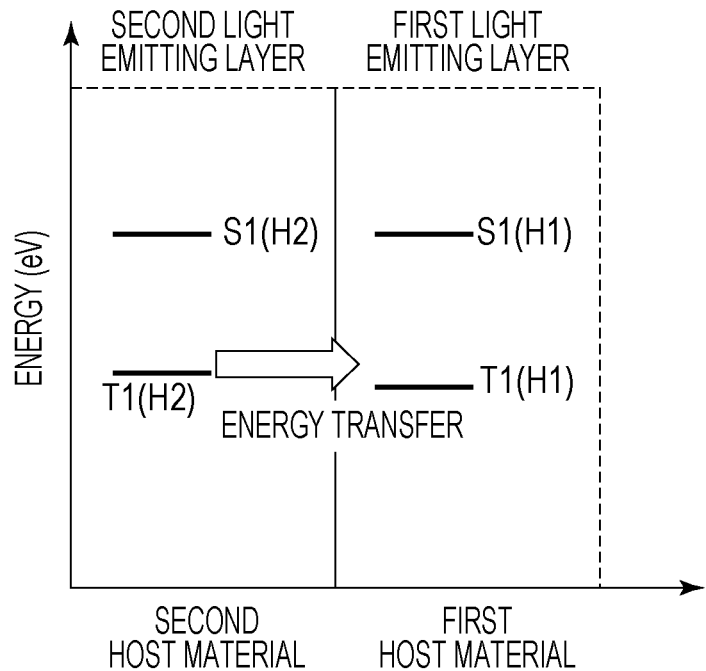
FIGS. 3A and 3B are schematic views explaining one embodiment of the present invention.
Figure 3B:
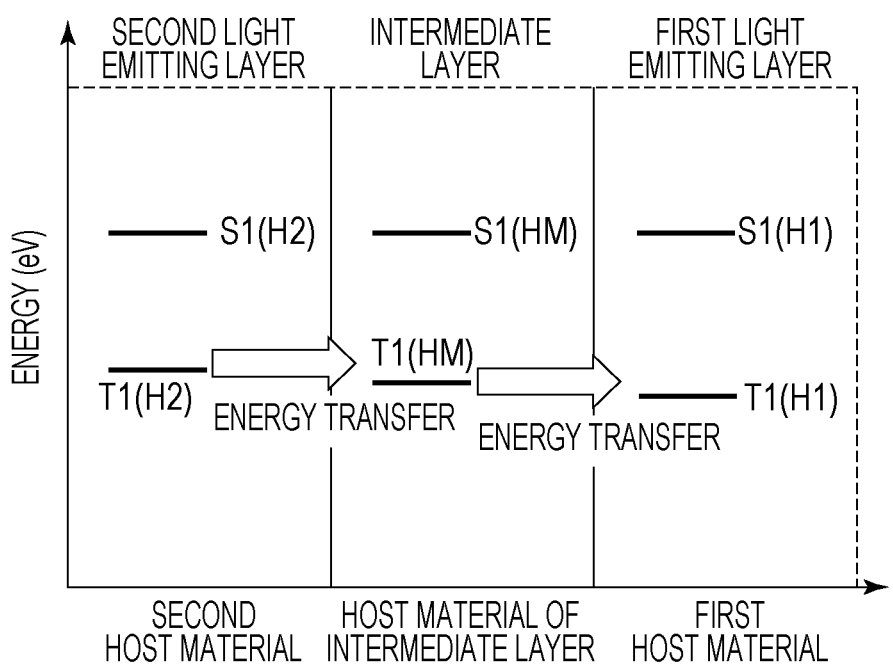

FIGS. 3A and 3B illustrate the energy transfer from the second light emitting layer 5 to the first light emitting layer 4. FIG. 3A illustrates an example in which the first light emitting layer 4 and the second light emitting layer 5 are in contact with each other. In FIG. 3A, a lowest triplet excitation energy T1(H1) of the first host material and a lowest triplet excitation energy T1(H2) of the second host material satisfy the relationship of the following expression (2).

$$T1(H1) \leq T1(H2) \quad (2)$$

By satisfying Expression (2), the lowest triplet excitation energy easily moves from the second light emitting layer 5 to the first light emitting layer 4. As a result, the triplet exciton density of the second light emitting layer 5 in which constituent materials are likely to deteriorate decreases, and therefore the element lifetime can be prolonged. Moreover, the emission efficiency can be improved by the TTA in the first light emitting layer 4.

In FIG. 3B, the intermediate layer disposed between the first light emitting layer 4 and the second light emitting layer 5 is illustrated. The relationship between a lowest triplet excitation energy T1(HM) of a host material of the intermediate layer, the T1(H1), and the T1(H2) satisfies the following expression (3).

$$T1(H1) \leq T1(HM) \leq T1(H2) \quad (3)$$

The organic light emitting element according to this embodiment may have a plurality of intermediate layers. Even in the case of having the plurality of intermediate layers, the organic light emitting element has the energy path of the lowest triplet excitation energy from the second light emitting layer 5 to the first light emitting layer 4. More specifically, the lowest triplet excitation energy of each intermediate layer is equal to or less than the lowest triplet excitation energy of a layer adjacent to the second light emitting layer 5 side among the intermediate layers and is equal to or higher than the lowest triplet excitation energy of the first host material. The intermediate layer may be a light emitting layer or may be a charge transport layer or the like. The intermediate layer may contain the same material as that of the first host material or the second host material or may be other materials.

The organic light emitting element according to this embodiment can achieve a long continuous drive lifetime by being configured as described above. This is because the movement of the triplet excitons from the second light emitting layer 5 to the first light emitting layer 4 is smoothly performed and a large number of triplet excitons are present in the first host material in the first light emitting layer 4. This is because the weight ratio of the first dopant material is low, and therefore the number of the triplet excitons to be trapped by the first dopant material is small. As a result, an effect that the TTA is likely to occur in the first host material and the emission efficiency of the organic light emitting element is high can be exhibited.

In the organic light emitting element according to this embodiment, the lowest triplet excitation energy T1 (H2) of the second host material and a lowest triplet excitation energy T1(D2) of the second dopant material may satisfy the relationship of Expression (4).

$$T1(H2) \leq T1(D2) \quad (4)$$

Thus, the triplet excitons are hardly trapped by the second dopant material in the second light emitting layer 5. Furthermore, by satisfying Expression (2), the triplet excitons are likely to smoothly move to the first light emitting layer 4.

In the organic light emitting element according to this embodiment, the first light emitting layer 4 may have a third dopant material and the lowest triplet excitation energy T1(H1) of the first host material and a lowest triplet excitation energy T1(D3) of the third dopant material may satisfy the relationship of Expression (5). When the third dopant material is contained in the second light emitting layer 5, the same relationship may also be satisfied with respect to the second light emitting layer 5. The same relationship specifically means that the following expression (6) is satisfied.

$$0 \text{ eV} < T1(H1) - T1(D3) < 0.3 \text{ eV} \quad (5)$$

$$0 \text{ eV} < T1(H2) - T1(D3) < 0.3 \text{ eV} \quad (6)$$

When Expression (5) is satisfied, the energy of the T1(D3) is lower than that of T1(H1), which is effective for causing the triplet excitons to stay in the first light emitting layer 4. The triplet exciton of the third dopant material has the energy that allows the triplet exciton to move to a host material. Since the triplet excitons are hard to be trapped by the third dopant, the TTA can be efficiently caused. The same effect can be achieved also with respect to the case of Expression (6). Thus, the continuous drive lifetime can be prolonged without impairing the emission efficiency.

In the organic light emitting layer element according to this embodiment, a material configuring the light emitting layer may have a difference between the lowest singlet excitation energy and the lowest triplet excitation energy of 0.2 eV or more. In this case, the intersystem crossing by thermal excitation from the lowest triplet excited state to the lowest singlet excited state can be suppressed. The emission passing through the intersystem crossing by thermal excitation is referred to as thermally activated delayed fluorescence.

While the emission lifetime of general fluorescence to be used in the organic light emitting element is the emission lifetime of nanosecond order, the emission lifetime of the thermally activated delayed fluorescence is the emission lifetime of microsecond order. Therefore, the energy of singlet excitons of a light emitting dopant causes energy transfer to triplet excitons of a host molecule close thereto before emitted as light emission. Then, a triplet exciton having higher-order energy Tn(H) than the lowest triplet excitation energy is formed, whereby cleavage of a single bond of organic molecules is likely to be caused.

Moreover, the lowest triplet excitation energy of the thermally activated delayed fluorescence material needs to be set to be high. Also in this point, the deterioration through the higher-order energy Tn(H) is likely to be promoted.

In the organic light emitting element according to this embodiment, the first host material and the second host material may be the same material. Thus, the triplet excitons can smoothly move from the first light emitting layer 4 to the second light emitting layer 5, so that an organic light emitting element having a longer continuous drive lifetime can be provided.

In the organic light emitting element according to this embodiment, the weight ratio of the first dopant material may be 0.05 wt % or more. When the weight ratio is less than 0.05 wt %, the doping concentration is excessively low, and thus the Forster-type energy transfer of the singlet excitons from the first host material to the first dopant material does not efficiently occur, so that the emission intensity of the first dopant material remarkably decreases in some cases.

X. Y. Zheng et al., ("A white OLED based on DPVBi blue light emitting host and DCJTB red dopant", Displays, 2003, Volume 24, 3, pp. 121-124) describe an emission spectrum of an organic light emitting element having a light emitting layer in which a DCJTB as a red light emitting material is mixed with a DPVBi of a host material. It is stated that, when the red light emitting material was set to 0.08 wt %, the emission peak derived from the red light emitting material was able to be confirmed but, when the red light emitting material was set to 0.03 wt %, the emission intensity derived from the red light emitting material remarkably decreased, so that the emission peak was not able to be confirmed.

Therefore, the concentration of the first dopant material in the organic light emitting element according to this embodiment may be 0.05 wt % or more and 0.30 wt % or less. Thus, an organic light emitting element in which both a continuous drive lifetime and emission efficiency are achieved can be provided.

The first host material provided in the organic light emitting element according to one embodiment of the present invention may be a low molecular organic compound. Organic compounds are roughly classified into a low molecular type, an oligomer molecule type, and a macromolecule type based on the molecules. The macromolecule and the oligomer molecule are defined as follows by International Union of Pure and Applied Chemistry (IUPAC) Commission on Macromolecular Nomenclature.

Macromolecule, Polymer molecule: A molecule of high molecular mass, the structure of which contains the multiple repetition of units derived, actually or conceptually, from molecules of low relative molecular mass.

Oligomer molecule: A molecule of intermediate relative molecular mass, the structure of which contains a small plurality of repetition of units derived, actually or conceptually, from molecules of lower relative molecular mass.

The low molecular organic compound refers to a molecule which does not fall under the definition of the macromolecule, the polymer molecule, and the oligomer molecule described above. More specifically, the molecule is a molecule in which the number of repetitions of the repeating unit is small, preferably 3 or less and more preferably 1.

The macromolecules include a synthetic macromolecule obtained by mainly performing chemical synthesis and a natural macromolecule present in the nature. While the natural macromolecules include macromolecules with a monodisperse molecular weight, the synthetic macromolecules generally have dispersibility of the molecular weight due to a difference in the repeating unit. On the other hand, the organic low molecular compound is not naturally present and is obtained by synthesis but does not have the dispersibility of the molecular weight due to the difference in the repeating unit.

The presence or absence of such dispersibility produces a significant difference when the macromolecular compound is used for a light emitting layer of an organic light emitting element. It is considered that, when the macromolecular compound having the dispersibility is used for the light emitting layer, the extension in terms of energy of the state density of the lowest triplet excitation energy of a compound contained in the light emitting layer increases and the triplet excitons in the light emitting layer become hard to be controlled, so that an effect becomes little.

It is desirable that all the light emitting layers of the organic light emitting element according to one embodiment of the present invention contain the low molecular organic compounds.

In the organic light emitting element according to this embodiment, the second dopant material may be a hydrocarbon compound. The hydrocarbon compound is a compound containing carbon and hydrogen. In general, the hydrocarbon compound is a material in which the bond energy of the single bond is high and is hard to cause bond cleavage deterioration. For example, the dissociation energy required for the dissociation of the C atom-C atom single bond (C—C single bond) of aromatic hydrocarbons or the C—C single bond of aromatic hydrocarbon and an alkyl group is approximately 4 eV to 5 eV. Conversely, the dissociation energy of the C atom-N atom single bond (C—N single bond) of an amino group and aromatic hydrocarbon or the C—N single bond like the bond of a heterocycle and aromatic hydrocarbon is approximately 3 eV to 4 eV, for example. Since the dissociation energy of the C—N single bond is lower than that of the C—C single bond, the bond is likely to dissociate via an excited state.

The first dopant according to this embodiment has a low lowest triplet excitation energy and is hard to deteriorate as compared with the first host material. However, when the triplet excitons are trapped, the first dopant may undergo the energy transfer from neighboring molecules to enter a higher-order triplet excited state. Therefore, an organic light emitting element having a longer continuous drive lifetime can be provided by using the hydrocarbon compound for the first dopant material.

In the organic light emitting element according to this embodiment, when the second dopant material is a blue light emitting material, a hydrocarbon compound not containing the C—N single bond of an amino group and aromatic hydrocarbon or the C—N single bond of heterocycles and aromatic hydrocarbon in the molecule is desirable. This is because the bond cleavage may occur merely due to the formation of the lowest excited singlet state when the C—N single bond is included, although it is considered that the contribution to the deterioration via the excited state of the first dopant material is smaller than that of the first host material.

In the present invention, the second dopant material may be a blue light emitting material, the first dopant material may be a red light emitting material, and the third dopant material may be a green light emitting material. Thus, an organic light emitting element displaying good white color can be provided. In this specification, the blue light emitting material refers to a light emitting material in which the maximum peak wavelength of an emission spectrum is 430 nm to 480 nm. The green light emitting material refers to a light emitting material in which the maximum peak wavelength of an emission spectrum is 500 nm to 570 nm. The red light emitting material refers to a light emitting material in which the maximum peak wavelength of an emission spectrum is 580 nm to 680 nm. The maximum peak wavelength can also be said to be the shortest peak wavelength among spectra.

With respect to the measurement of the lowest singlet excitation energy, the lowest singlet excitation energy can be determined from a visible light-ultraviolet absorption spectrum. Measuring the lowest singlet excitation energy means measuring an energy gap. In this embodiment, the lowest singlet excitation energy can be determined from the absorption edge of a thin film formed on a glass substrate. As an apparatus, a spectrophotometer U-3010 manufactured by Hitachi, Ltd. is usable.

With respect to the highest occupied molecular orbital (HOMO) energy, the ionization potential can be measured using a photoelectron spectroscopy in atmospheric pressure (Measuring instrument name AC-2 manufactured by RIKENKIKI CO, LTD).

The lowest unoccupied molecular orbital (LUMO) energy can be calculated from an energy gap measured value and the above-described ionization potential. More specifically, Electron affinity=Ionization potential−Energy gap is given.

The lowest triplet excitation energy can be determined from a phosphorescence spectrum of a target organic material. Specifically, the phosphorescence spectrum is measured under a low temperature, such as liquid nitrogen temperature (77 K), and then T1 energy can be obtained from the first emission peak (shortest wavelength peak) of the measured phosphorescence spectra.

For one in which phosphorescence emission is not obtained, the energy transfer from a triplet sensitizer is used. The method is applicable also to one in which phosphorescence is weak and is unmeasurable.

When phosphorescence cannot be measured by the above-described method because the emission efficiency of the phosphorescence is very low, there is a method of obtaining the lowest triplet excitation energy using triplet-triplet energy transfer to an acceptor.

When phosphorescence emission is not obtained even when performing the above-described measurement, the lowest triplet excitation energy can be obtained by molecular orbital calculation according to the following calculation technique.

The molecular orbital method calculation can be carried out by Gaussian 09, which is currently widely used, (Gaussian 09, Revision A. 02, M. J. Frisch. G. W. Trucks, H. B. Schlegel, G. E. Scuseria, M. A. Robb, J. R. Cheeseman, G. Scalmani, V. Barone. B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery. Jr., J. E. Peralta. E Ogliaro, M. Bearpark, J. J. Heyd, E. Brothers, K. N. Kudin, V. N. Staroverov, R. Kobayashi, J. Normand, K. Raghavachari, A. Rendell, J. C. Burant, S. S. Iyengar, J. Tomasi, M. Cossi, N. Rega. J. M. Millam, M. Klene, J. E. Knox, J. B. Cross, V. Bakken. C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas. J. B. Foresman, J. V. Ortiz, J. Cioslowski. and DJ. Fox. Gaussian, Inc., Wallingford Conn., 2009). As the calculation technique, the following technique which is currently widely used is usable. First, the structure optimization of a ground state is calculated by a density functional theory (DFT) using B3LYP for a functional and 6-31G* for a basis function.

Next, in the optimized structure, the lowest excitation triplet exciton (absorption) energy is calculated by Time-dependent density-functional theory (TDDFT) using the B3LYP for a functional and using the 6-31G* for a basis function. For the calculation of the DFT and the TDDFT, calculation chemistry software having a similar function is used instead.

When comparing the lowest triplet excitation energies of a plurality of materials, the comparison is performed while unifying measuring methods or calculation methods.

With respect to the lowest singlet excitation energy, a calculated value can be obtained as a result by a method similar except obtaining the lowest singlet excitation energy in the calculation technique of the lowest triplet excitation energy described above. When the lowest singlet excitation energy and the lowest triplet excitation energy of a compound are compared, the comparison is performed by unifying techniques, e.g., actual measured values or calculated values.

Figure 4:
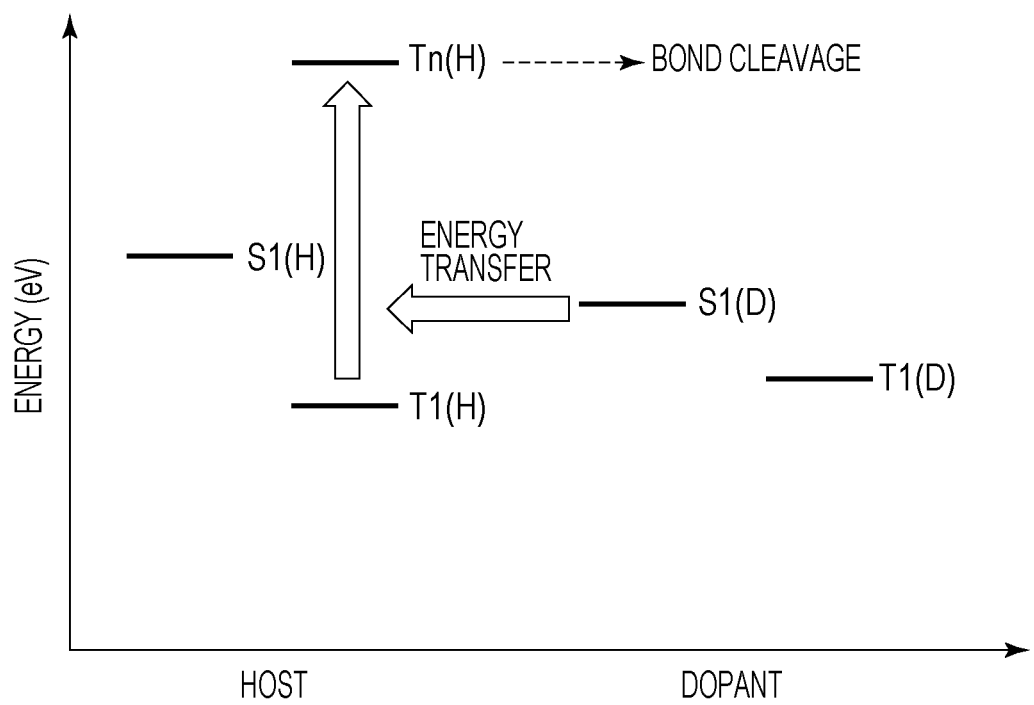
FIG. 4 is a schematic view explaining a material deterioration mechanism of an organic light emitting element.

FIG. 4 is a figure illustrating a deterioration mechanism of an organic light emitting element emitting fluorescence. Energy S1(D) of a singlet exciton of a light emitting dopant causes energy transfer to the lowest triplet excitation energy T1(H) of a host material. Thus, a triplet exciton of higher-order energy Tn(H) is formed. The mechanism is known in which, when the energy Tn(H) having high energy is deactivated in a light emitting layer, the single bond of organic molecules is cleaved (Japanese Patent Laid-Open No. 2011-216640). The excitation lifetime of a triplet exciton is long, and therefore the density in a film is also high, and thus it is assumed that the energy transfer process described above occurs at a relatively high frequency.

At this time, when the emission wavelength of the light emitting dopant is a shorter wavelength, the high energy S1(D) of a singlet exciton moves to a triplet exciton, and therefore the total energy Tn(H) increases, so that material deterioration is likely to be caused. Therefore, the second light emitting layer 5 having a second dopant having an emission wavelength shorter than that of the first dopant is likely to cause material deterioration. Therefore, it is advantageous in the continuous drive lifetime to collect triplet excitons in the first light emitting layer 4 having the first dopant having an emission wavelength longer than that of the second dopant.

Configuration of Organic Light Emitting Element According to One Embodiment of the Present Invention Substrate A substrate of the organic light emitting element according to this embodiment may be a Si substrate, a glass substrate, or a resin substrate. In the case of the Si substrate, a microdisplay apparatus can be configured by forming a transistor in the Si itself. In the case of the glass substrate, a display apparatus may be configured by providing a TFT. The resin substrate can also be said to be a flexible substrate. In the case of the flexible substrate, a foldable or rollable display apparatus may be acceptable. Insofar as the emission direction of the light emitting apparatus is not blocked, the substrate may be a transmitting substrate or a non-transmitting substrate.

Electrode

In this embodiment, although the first electrode is an anode and the second electrode is a cathode, the first electrode may be a cathode and the second electrode may be an anode. When extracting light from the second electrode side, the first electrode may be a reflector.

The first electrode of the organic light emitting element according to this embodiment may be a metal material having 80% or more reflectance. Specifically, metals, such as Al and Ag. and alloys obtained by adding Si, Cu, Ni, Nd, Ti, and the like thereto are usable. As the alloy, AgMg, AlCu, TiN, and the like are usable. The reflectance refers to the reflectance in the wavelength of emission emitted from the light emitting layer. The reflector may have a barrier layer on the surface on the light extraction side. Materials of the barrier layer may be metals, such as Ti, W, Mo, and Au, or alloys thereof. The alloys may include the alloys mentioned above.

The second electrode of the organic light emitting element according to this embodiment may be a semitransmitting reflective layer having a property of transmitting a part of light reaching the surface thereof and reflecting the other part thereof (i.e., semitransmitting reflexibility). An upper electrode is formed of simple metals, such as magnesium and silver, alloys containing magnesium and silver as the main component, or alloy materials containing alkali metals and alkaline earth metals.

When the second electrode contains an alloy, an alloy of magnesium and silver is mentioned, for example. In the case of the alloy of magnesium and silver, an alloy containing magnesium and silver in a ratio of 1:1 may be acceptable and the at % of either one thereof may be larger. When the at % of either one thereof is larger, the at % of silver may be larger. The at % of silver may be increased because the transmittance is high. When the at % of either one thereof is larger, the at % of magnesium may be larger. The at % of magnesium may be increased because the film property is high and a film is hard to be cut.

The second electrode may have a laminated configuration insofar as the transmittance is desirable.

Organic Compound Layer

The organic compound layer according to this embodiment may be formed as a common layer of a plurality of organic light emitting elements. The common layer is disposed ranging over the plurality of organic light emitting elements and can be formed by performing coating methods, such as spin coating, or a vapor deposition method to the entire surface of the substrate.

The organic compound layer according to this embodiment is a layer containing at least a light emitting layer and may contain a plurality of layers. Examples of the plurality of layers include a hole injection layer, a hole transport layer, an electron blocking layer, a light emitting layer, a hole blocking layer, and an electron transport layer. Each organic compound layer may contain a plurality of materials. The weight ratio in that case may be 1:1 to 4. The organic compound layer emits light by recombination of a hole injected from an anode and an electron injected from a cathode in the light emitting layer.

The light emitting layer may contain a plurality of layers, can have a red light emitting material, a green light emitting material, and a blue light emitting material in any of the light emitting layers, and can emit white light by mixing each emission color. White color may be emitted by providing light emitting materials in a complementary color relationship, such as a blue light emitting material and a yellow light emitting material, in any of the light emitting layers. The number of the light emitting layers may be 2 or 3 or may have a larger number of layers. The plurality of light emitting layers may individually emit light of different colors. A light emitting layer emitting light of the same color as that of the other light emitting layers may be provided.

When emitting white color from the plurality of light emitting layers, e.g., the first light emitting layer 4 and the second light emitting layer 5, the organic light emitting element may have a color filter on the light emitting side. By combining the white emission and the color filter, required emission colors, such as RGB, can be obtained.

Compounds contained in the light emitting layer are not particularly limited and may be anthracene derivatives, fluorene derivatives, pyrene derivatives, fluoranthene derivatives, chrysene derivatives, triphenylene derivatives, and iridium complexes. The compounds may be hosts or may be guests.

The first dopant may be any of a fluorene derivative, a fluoranthene derivative, a pyrene derivative, a rubrene derivative, a perylene derivative, and a boron complex.

Hereinafter, specific examples of organic compounds to be used for the organic compound layer are illustrated. The present invention is not limited to these exemplified compounds.

As host materials of the organic light emitting element according to this embodiment, the following compounds can be mentioned, for example. The host material may be a first host, may be a second host, or a host of a light emitting layer to be further provided.

EM1 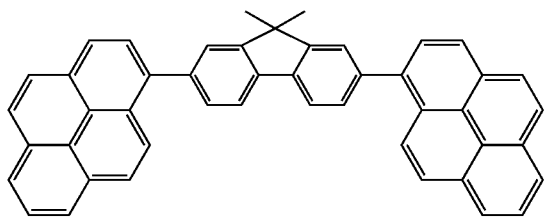
EM2 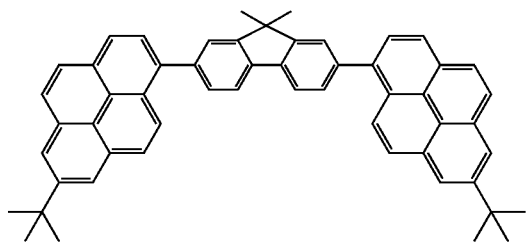
EM3 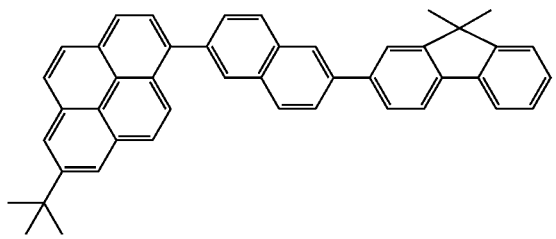
EM4 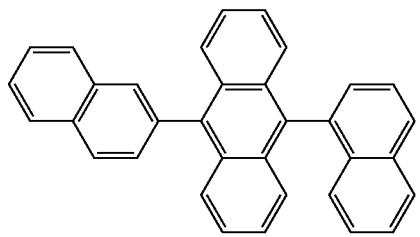
EM5 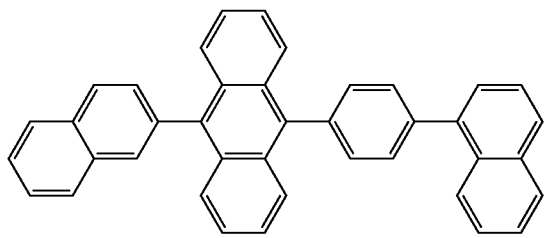
EM6 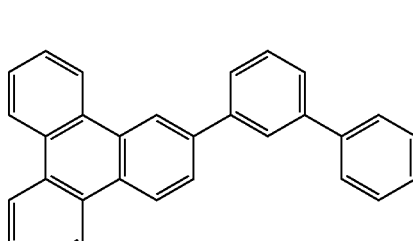
EM7 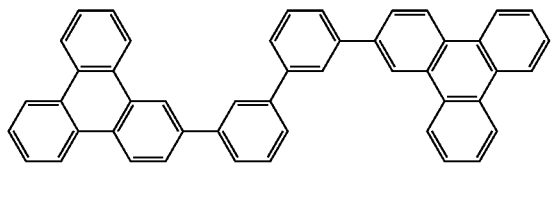
EM8 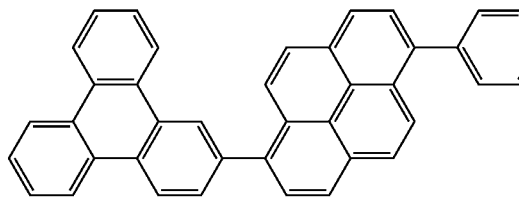
EM9 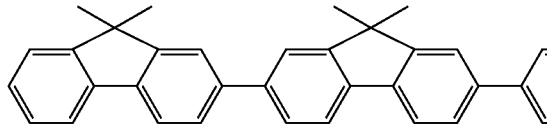
EM10 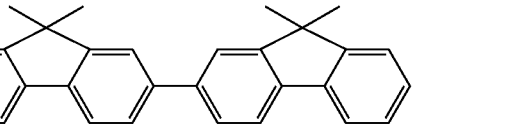
EM11 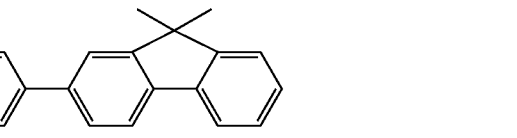
EM12 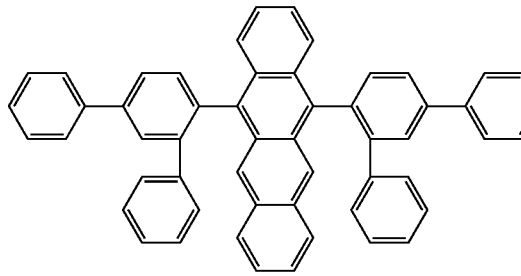
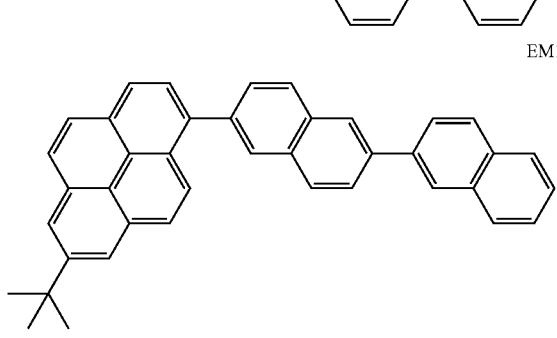

-continued
EM13
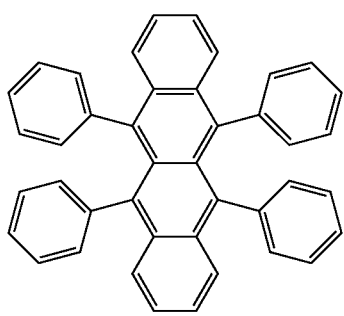
EM14
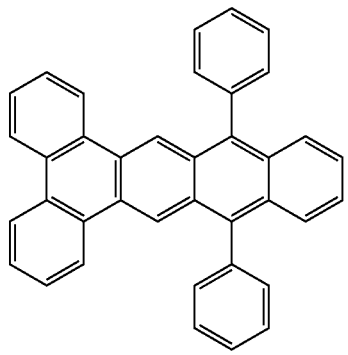
EM15
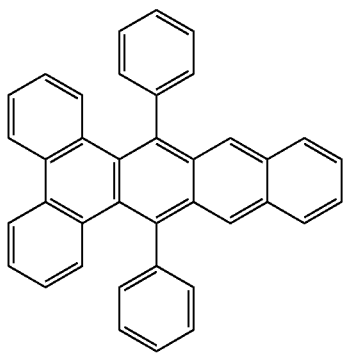
EM16
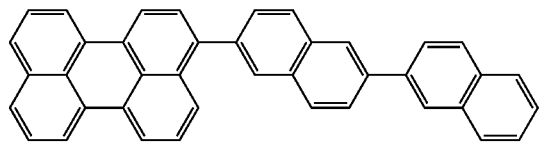
EM17
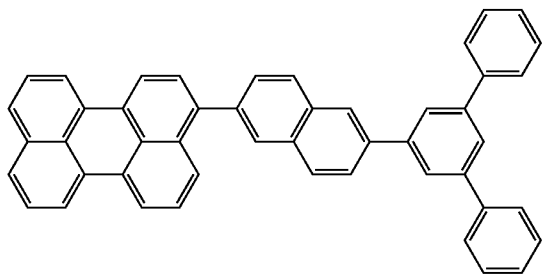
EM18
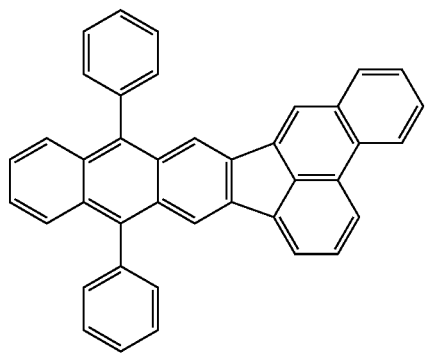
EM19
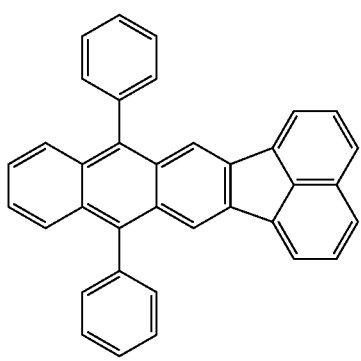
EM20
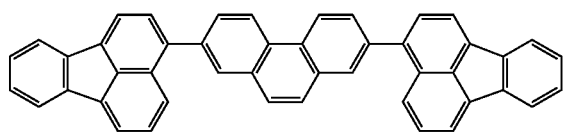

-continued

EM21
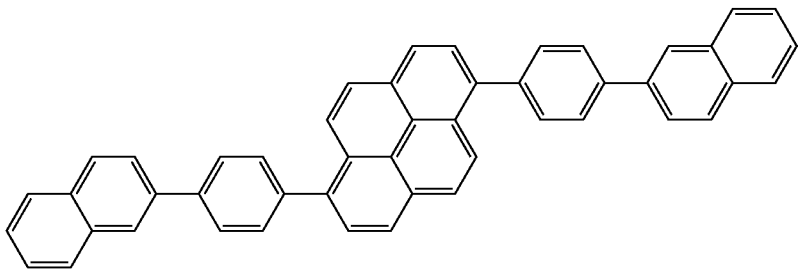

EM22
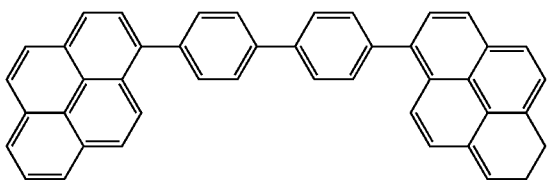

EM23
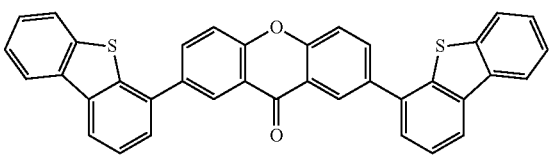

EM24
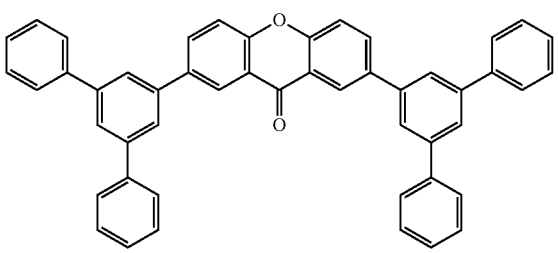

EM25
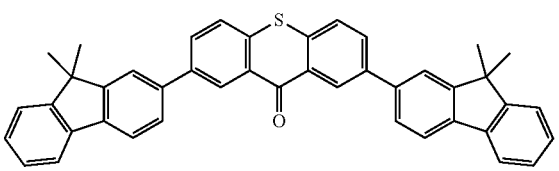

EM26
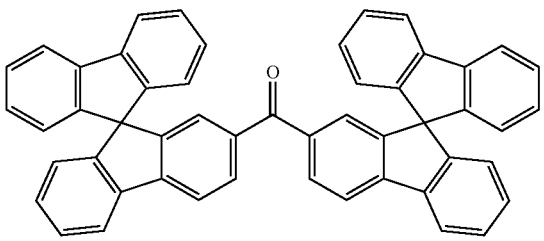

EM27
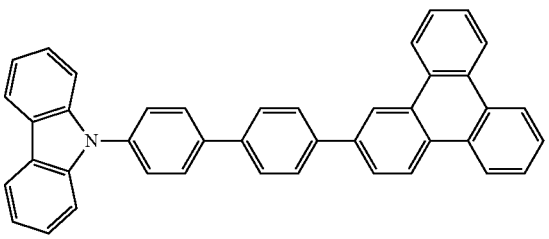

The compounds of EM 1 to 3 and 21 to 22 are desirable because the compounds have a pyrene skeleton in a partial structure thereof. In the compound having the pyrene skeleton, the pyrene skeletons having large planarity are easily stacked to each other and triplet excitons easily move. As a result, the TTA can be efficiently caused. The EMI can be synthesized by a method described in Japanese Patent Laid-Open No. 2007-063285, the EM23 can be synthesized by a method described in Japanese Patent Laid-Open No. 2011-249754, the EM25 can be synthesized by a method described in Japanese Patent Laid-Open No. 2012-102024, and the EM26 can be synthesized by a method described in International Publication No. 2005/040302. The synthesis methods described in the publications may be altered as appropriate considering the compound synthesis amount and the type of substituents provided in the basic skeleton. For example, a halogen atom to be used for a coupling reaction may be changed to a halogen atom of another type. In order to reduce the halogen used for the coupling reaction from an end product, a dehalogenation process may be provided. In a synthesis process, a boronic acid derivative and a pinacolboronate derivative to be used, a halogen type of a halogen substance, a Pd catalyst to be used for a Suzuki coupling reaction, and the like may be changed. Examples of the Pd catalyst to be changed include (Pd(PPh$_3$)$_4$, Pd (PPh$_3$)$_2$Cl$_2$, Pd(OAc)$_2$, Pd(dba)$_2$, Pd(dba)$_3$, and the like. Moreover, S-Phos, X-Phos, tri-o-tolylphosphine, tricyclohexyl phosphine, and the like may be added as a phosphorus ligand to the catalyst A triflate substance may be used in place of the halogen substance. Moreover, a Negishi coupling using organic zinc or a Stille Coupling using organic tin may be used in place of the Suzuki coupling.

As the blue light emitting material of the organic light emitting element according to this embodiment, the following compounds can be mentioned, for example.

Chem. 2
BD1
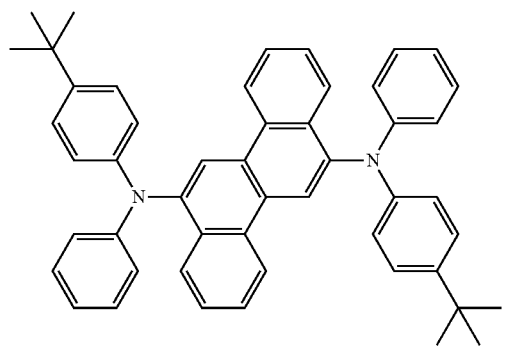
BD2
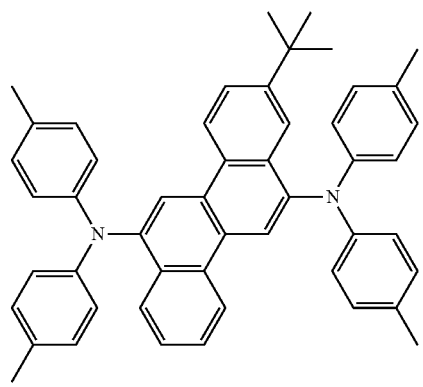
BD3
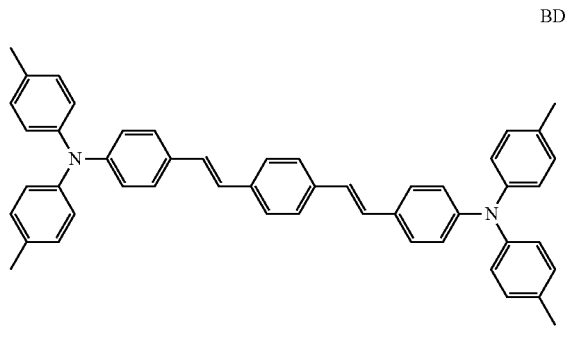
BD4
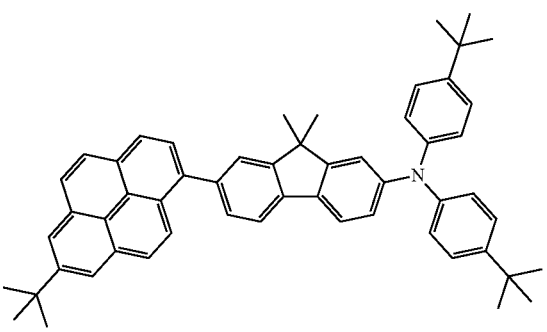
BD5
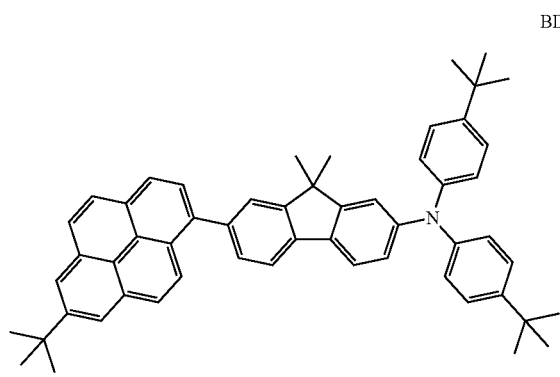
BD6
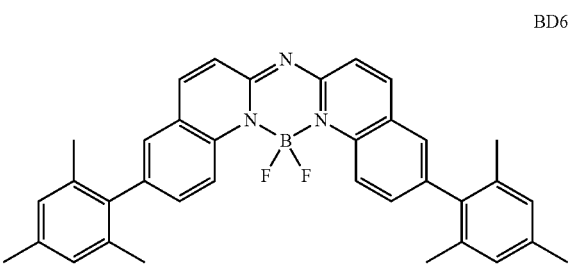
BD7
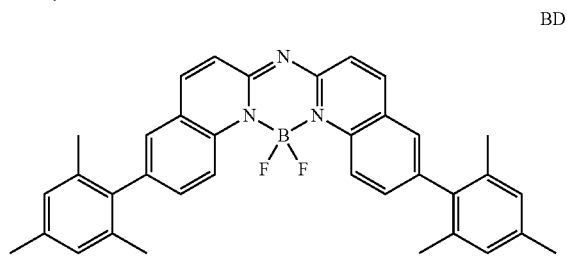
BD8
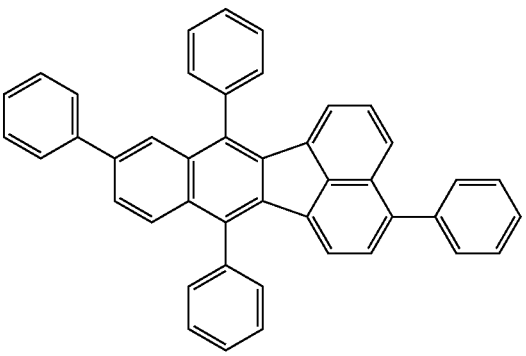

-continued
BD9
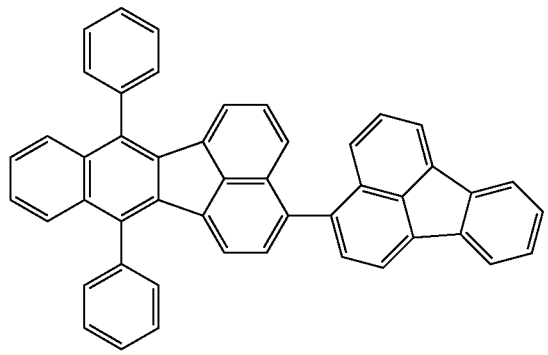
BD10
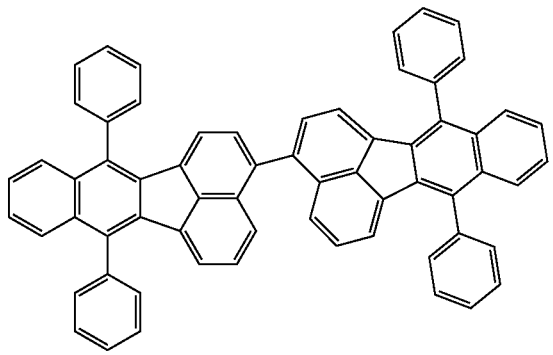
BD11
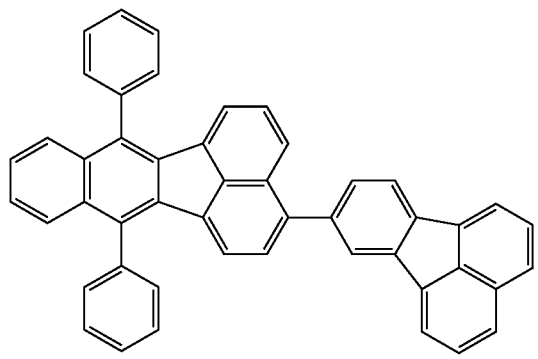
BD12
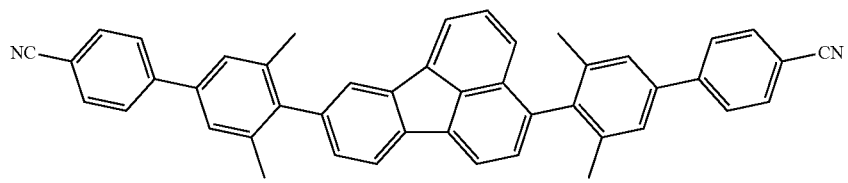
BD13
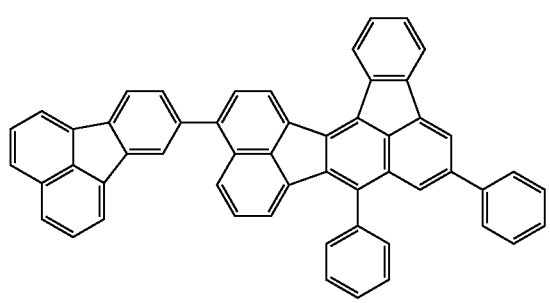
BD14
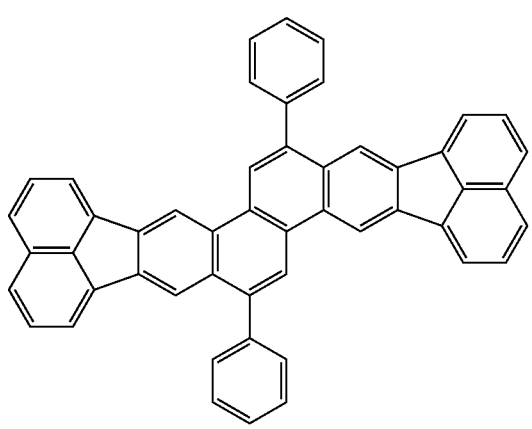

-continued
BD15
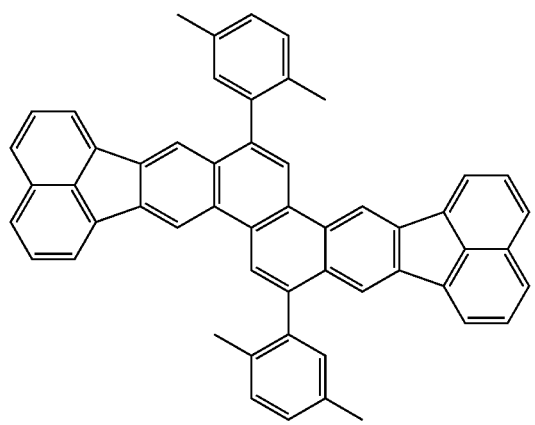
BD16
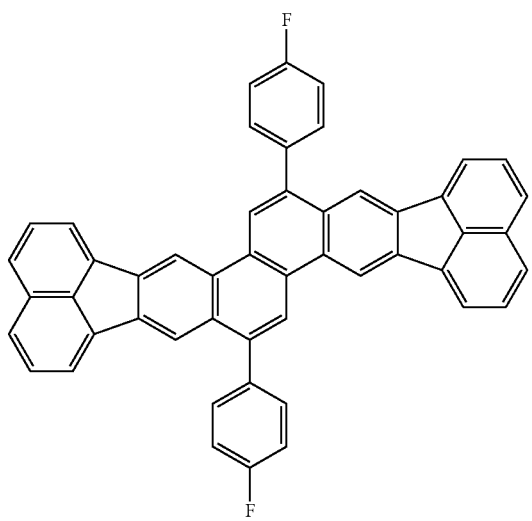
BD17
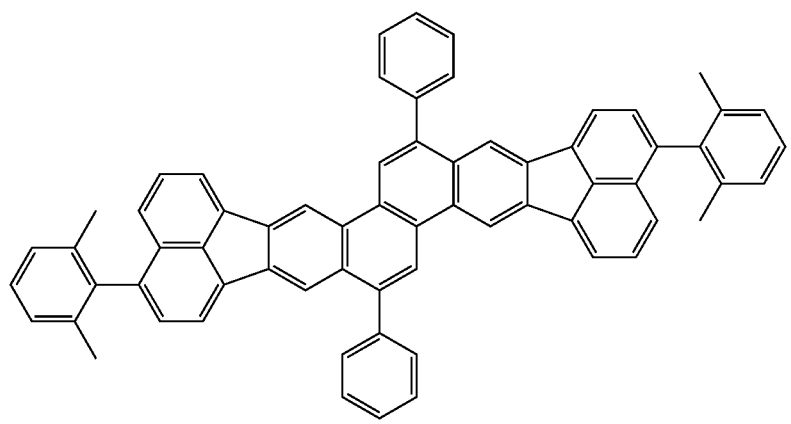
BD18
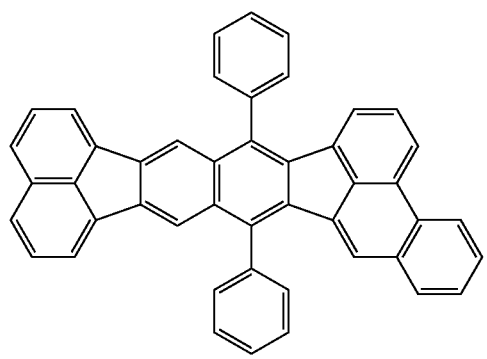
BD19
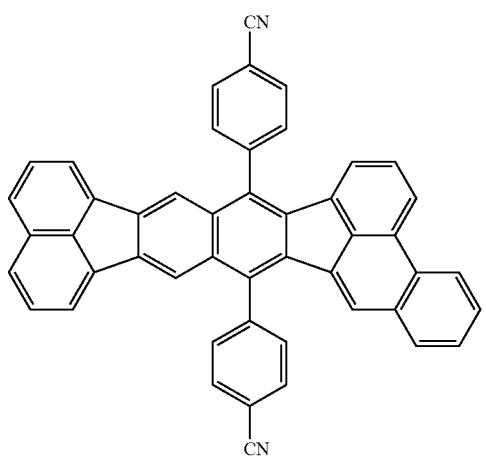

-continued
BD20
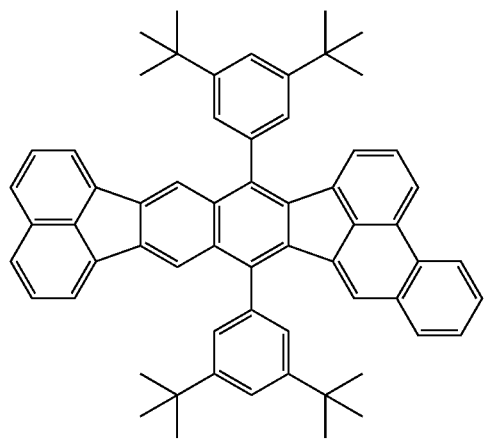
BD21
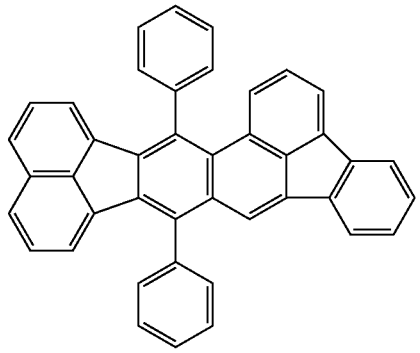
BD22
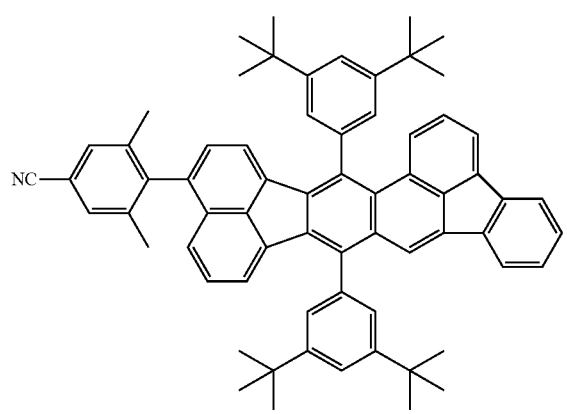
BD23
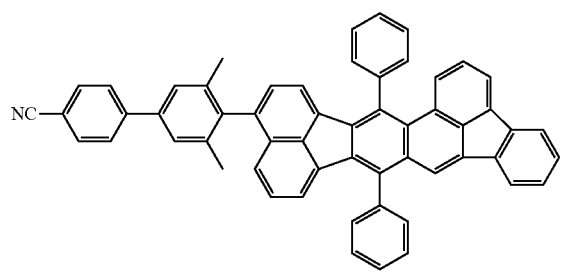
BD24
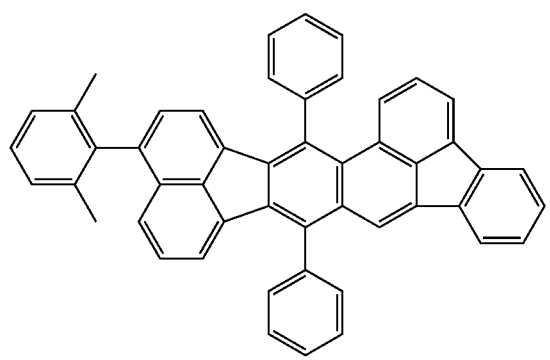
BD25
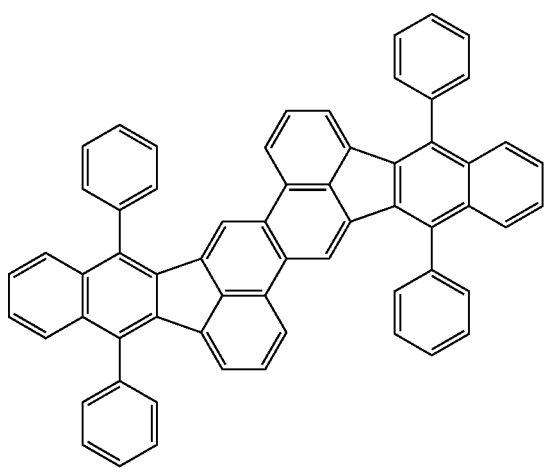

-continued

BD26
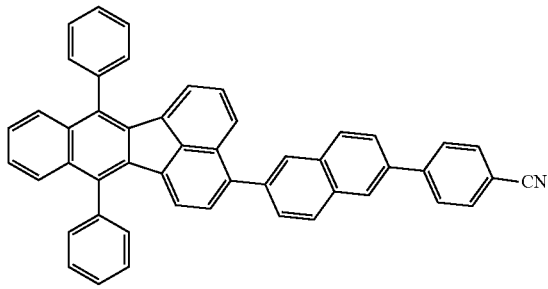

BD27
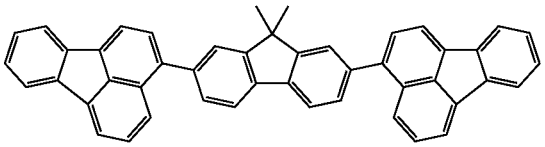

BD28
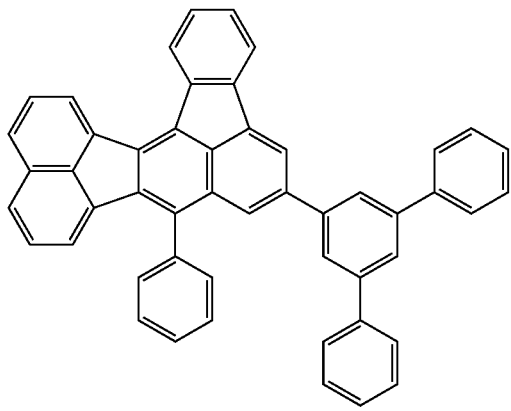

BD29
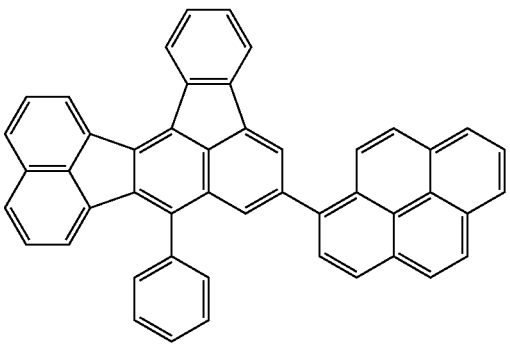

BD30
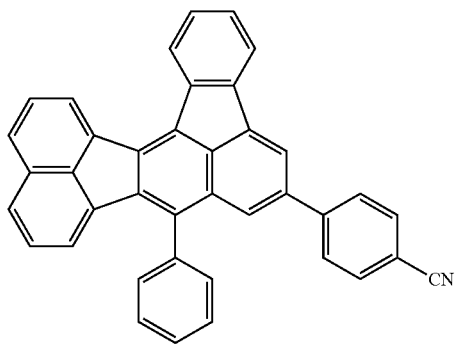

The BD 8 to 30 are desirable because the single bond configuring the compounds are limited to the C—C bond and the C—H bond having high bond energy. However, the bond of C and N of a cyano group is a triple bond and has higher bond energy as compared with a single bond and therefore the compound may be regarded as a hydrocarbon compound although having the C—N bond. The concentration of the blue light emitting material in the light emitting layer is preferably in the range of 0.1 wt % or more and 10 wt % or less. The concentration is more preferably in the range of 0.3 wt % or more and 2.0 wt % or less. The BD1 can be synthesized by a method described in Japanese Patent Laid-Open No. 9-241629, the BD9 can be synthesized by a method described in Japanese Patent Laid-Open No. 2008-297535, the BD16 can be synthesized by a method described in Japanese Patent Laid-Open No. 2010-143879, the BD23 can be synthesized by a method described in Japanese Patent Laid-Open No. 2012-246258, the BD25 can be synthesized by a method described in Japanese Patent Laid-Open No. 2009-221180, and the BD28 can be synthesized by a method described in Japanese Patent Laid-Open No. 2011-011994. The synthesis methods described in the publications may be altered as appropriate considering the compound synthesis amount and the type of substituents provided in the basic skeleton. For example, a halogen atom to be used for a coupling reaction may be changed to a halogen atom of another type. In order to reduce the halogen used for the coupling reaction from an end product, a dehalogenation process may be provided. In a synthesis process, a boronic acid derivative and a pinacolboronate derivative to be used, a halogen type of a halogen substance, a Pd catalyst to be used for a Suzuki coupling reaction, and the like may be changed. Examples of the Pd catalyst to be changed include $(Pd(PPh_3)_4, Pd(PPh_3)_2Cl_2, Pd(OAc)_2, Pd(dba)_2, Pd(dba)_3)$, and the like. Moreover, S-Phos, X-Phos, tri-o-tolylphosphine, tricyclohexyl phosphine, and the like may be added as a phosphorus ligand to the catalyst. A triflate substance may be used in place of the halogen substance. Moreover, a Negishi coupling using organic zinc or a Stille Coupling using organic tin may be used in place of the Suzuki coupling.

As the green light emitting material of the organic light emitting element according to this embodiment, the following compounds can be mentioned, for example.
Chem. 3
GD1
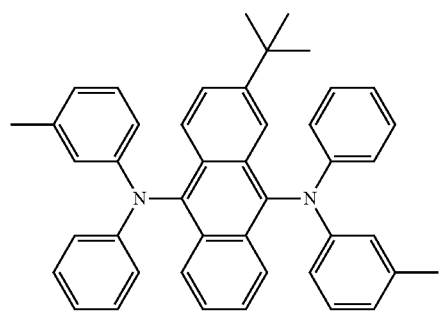
GD2
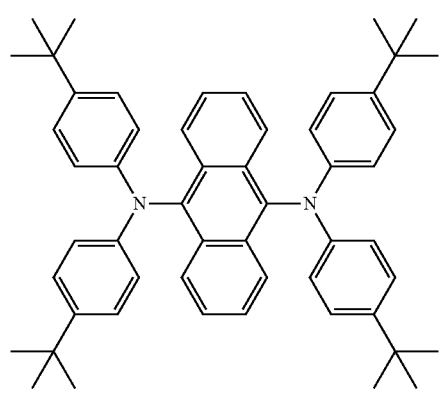
GD3
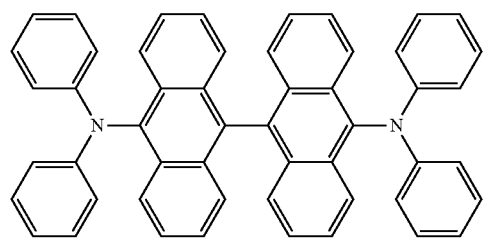
GD4
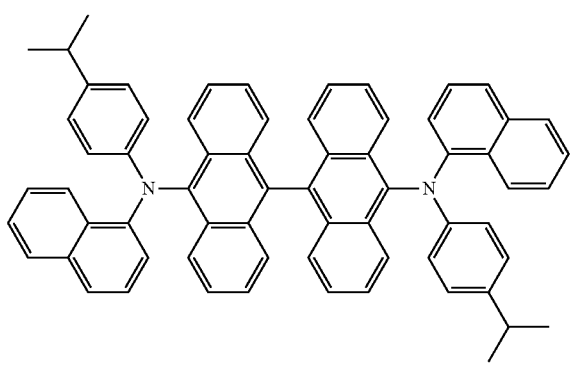
GD5
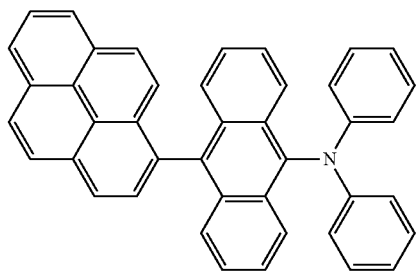
GD6
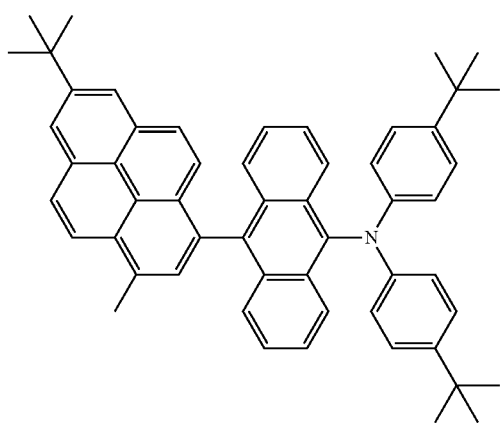
GD7
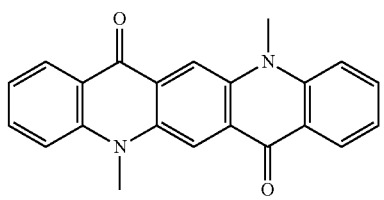
GD8
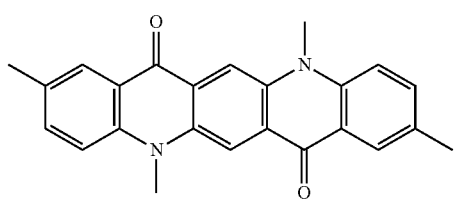
GD9
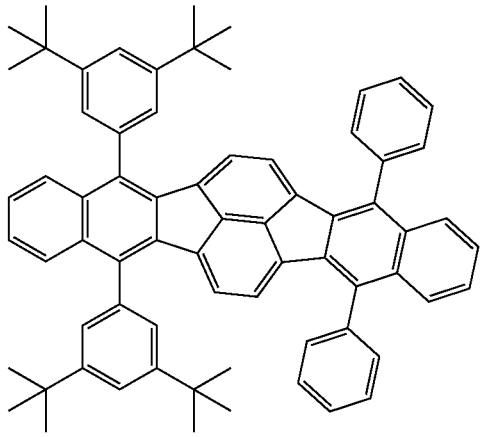

-continued
GD10
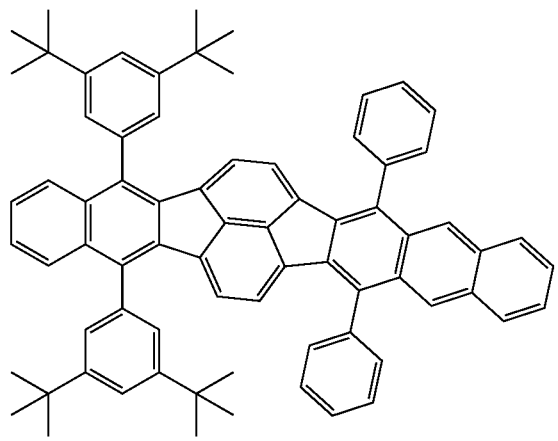
GD11
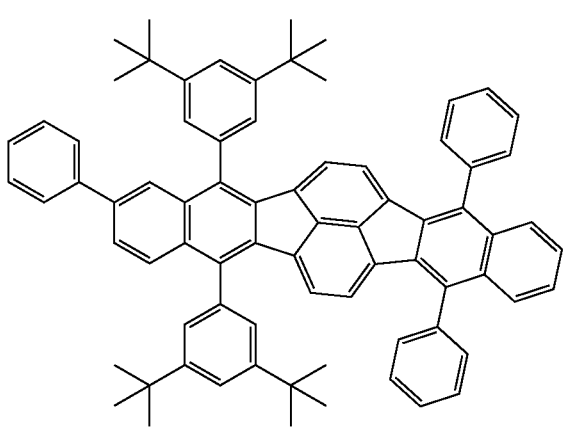
GD12
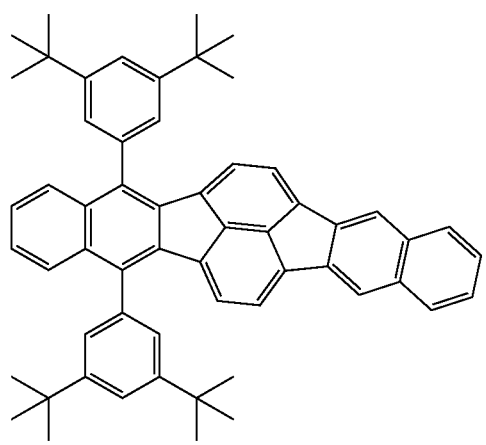
GD13
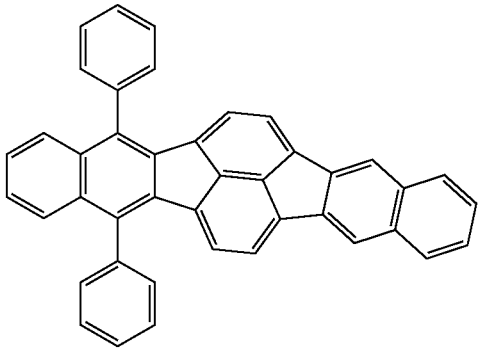
GD14
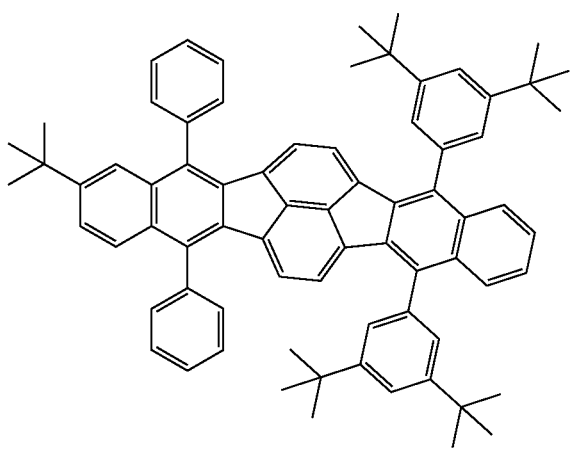
GD15
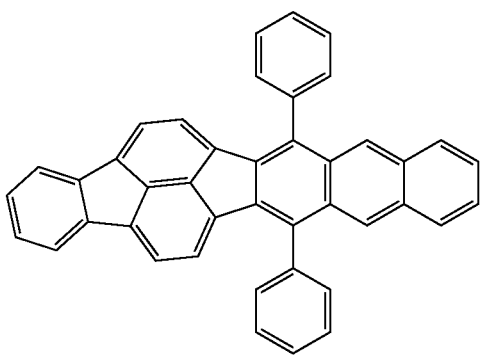
GD16
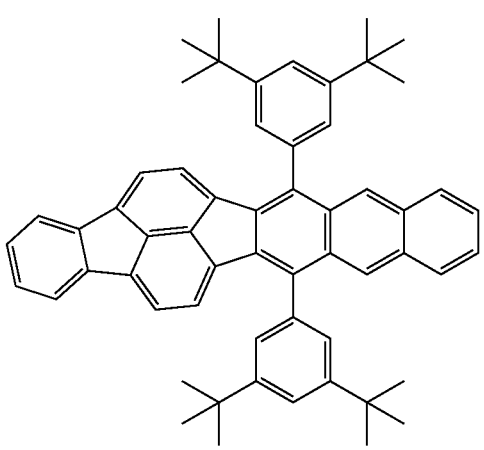

-continued
GD17
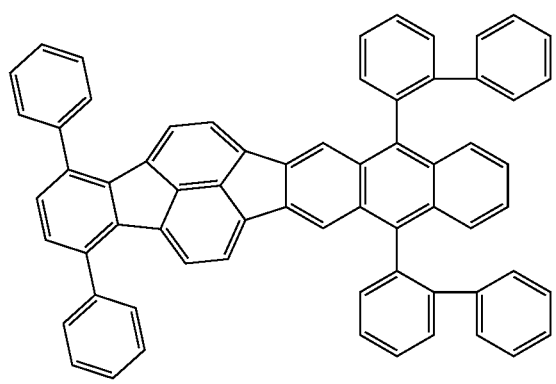
GD18
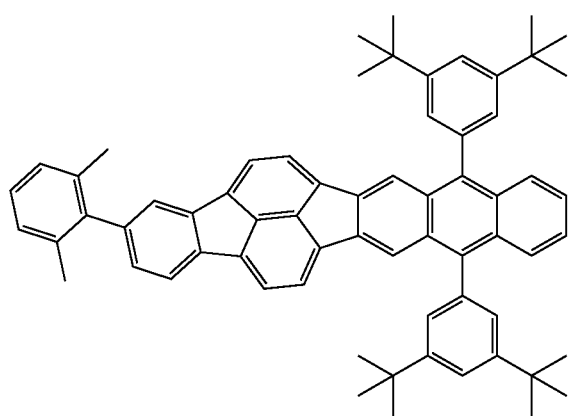
GD19
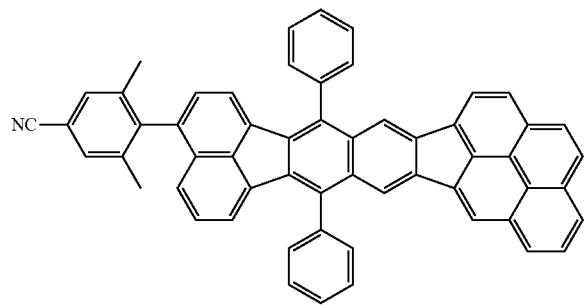
GD20
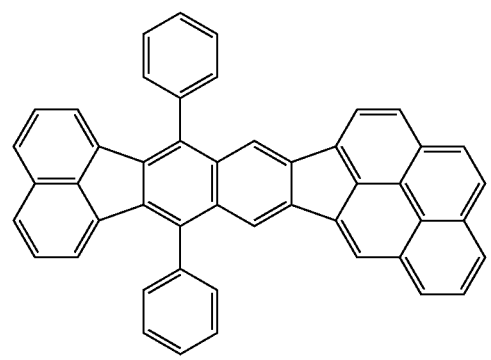
-continued
GD21
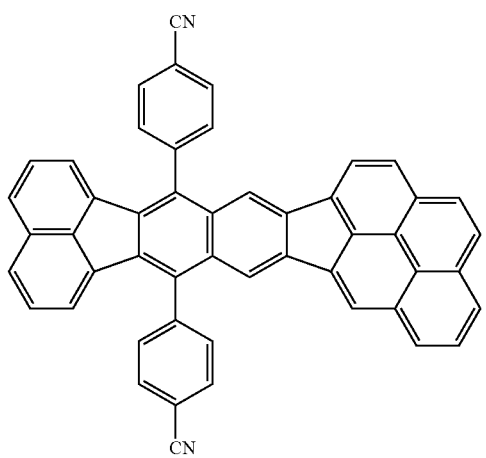
GD22
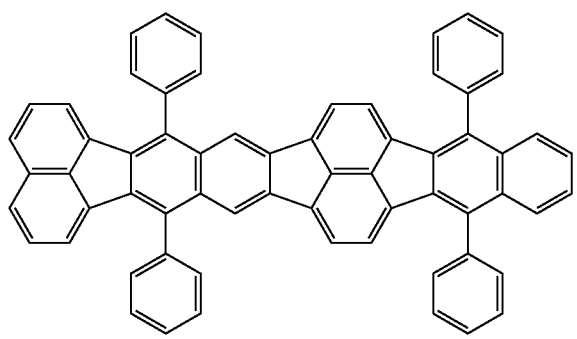
GD23
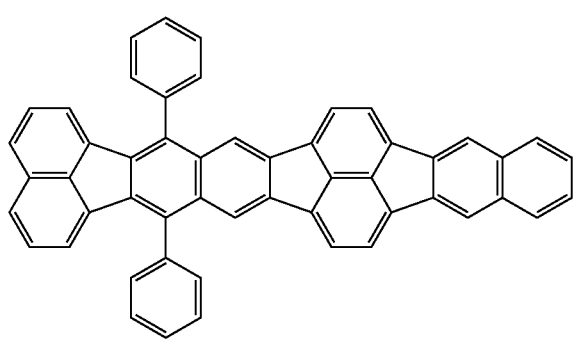
GD24
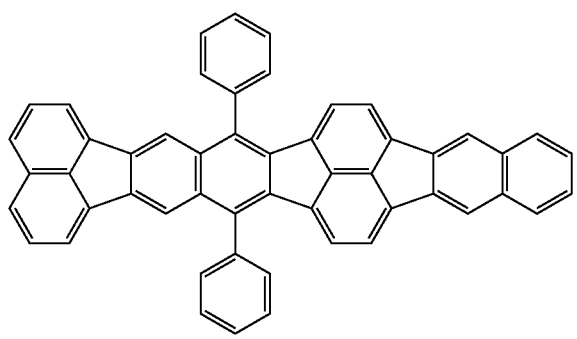

GD25

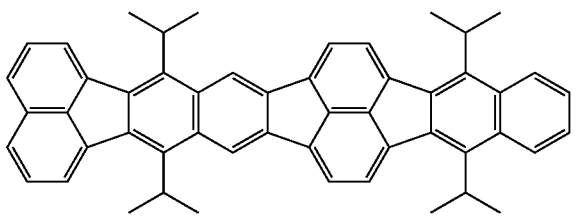

GD26

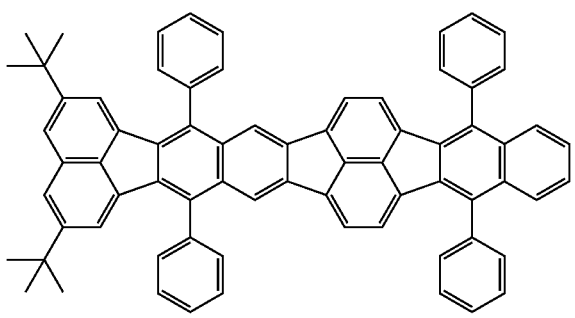

GD27

GD28

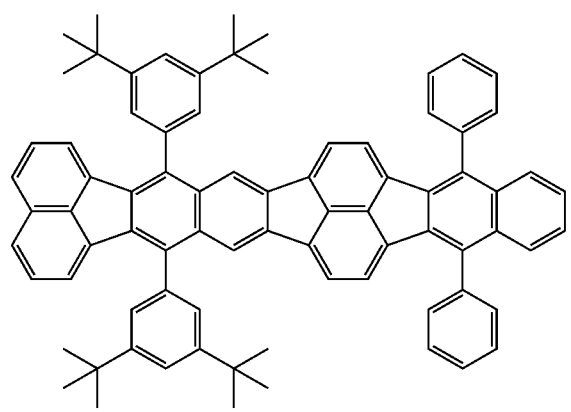

GD29

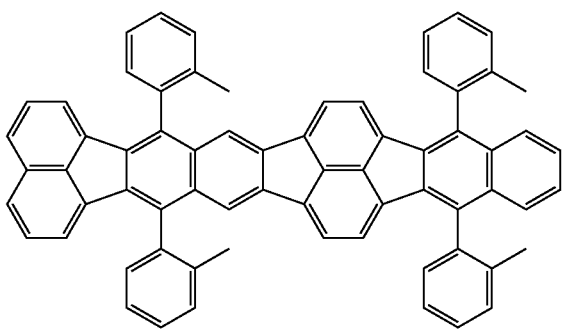

GD30

The GD 8 to 31 are hydrocarbon compounds and are desirable in order to achieve a long continuous drive lifetime. The concentration of the green light emitting material in the light emitting layer is preferably in the range of 0.1 wt % or more and 10.0 wt % or less. The concentration is more preferably in the range of 0.5 wt % or more and 5.0 wt % or less. The GD5 can be synthesized by a synthesis method described in Japanese Patent Laid-Open No. 2006-176493, the GD13 can be synthesized by a synthesis method described in Japanese Patent Laid-Open No. 2008-255095, the GD16 can be synthesized by a synthesis method described in Japanese Patent Laid-Open No. 2011-256113, the GD21 can be synthesized by a synthesis method described in Japanese Patent Laid-Open No. 2012-001514, and the GD29 can be synthesized by a synthesis method described in Japanese Patent Laid-Open No. 2013-067586. The synthesis methods described in the publications may be altered as appropriate considering the synthesis amount and the type of substituents provided in the basic skeleton. For example, a halogen atom to be used for a coupling reaction may be changed to a halogen atom of another type. In order to reduce the halogen used for the coupling reaction from an end product, a dehalogenation process may be provided. In a synthesis process, a boronic acid derivative and a pinacolboronate derivative to be used, a halogen type of a halogen substance, a Pd catalyst to be used for a Suzuki coupling reaction, and the like may be changed. Examples of the Pd catalyst to be changed include $(Pd(PPh_3)_4, Pd(PPh_3)_2Cl_2, Pd(OAc)_2, Pd(dba)_2, Pd(dba)_3$, and the like. Moreover, S-Phos, X-Phos, tri-o-tolylphosphine, tricyclohexyl phosphine, and the like may be added as a phosphorus ligand to the catalyst. A triflate substance may be used in place of the halogen substance. Moreover, a Negishi coupling using organic zinc or a Stille Coupling using organic tin may be used in place of the Suzuki coupling. As the red light emitting material of the organic light emitting element according to this embodiment, the following compounds can be mentioned, for example.

Chem. 4
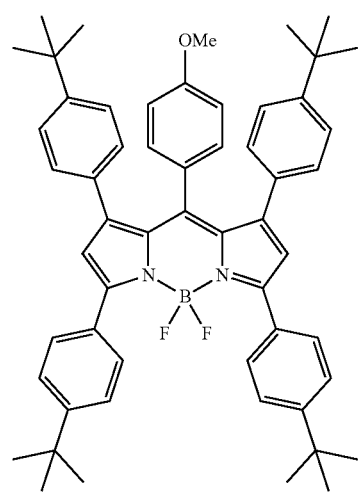
RD1
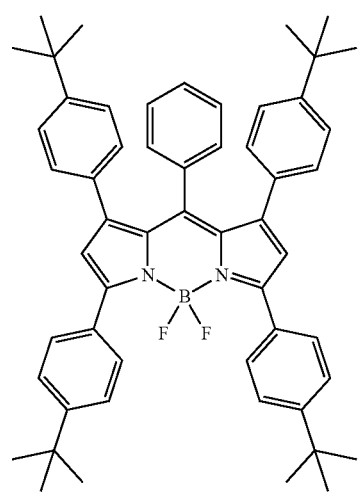
RD2
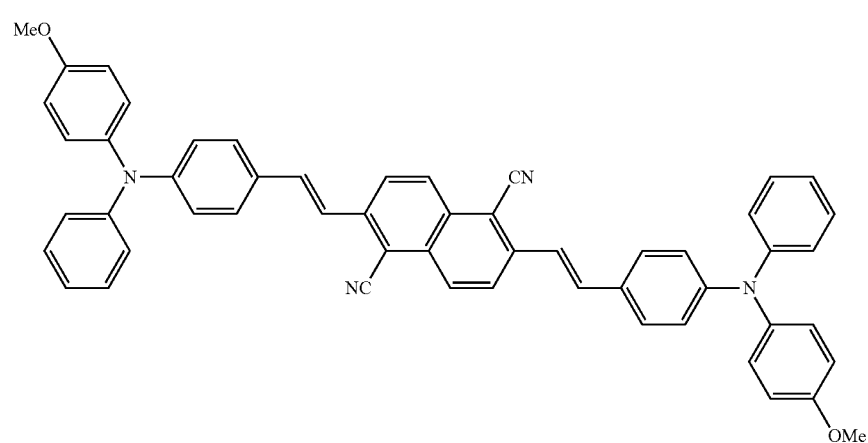
RD3
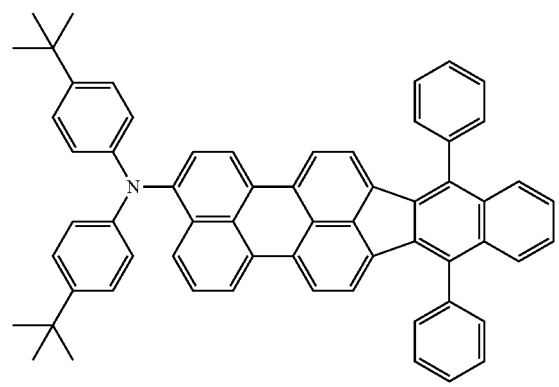
RD4
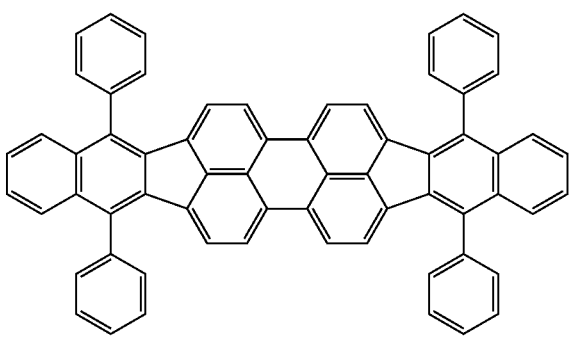
RD5

-continued
RD6
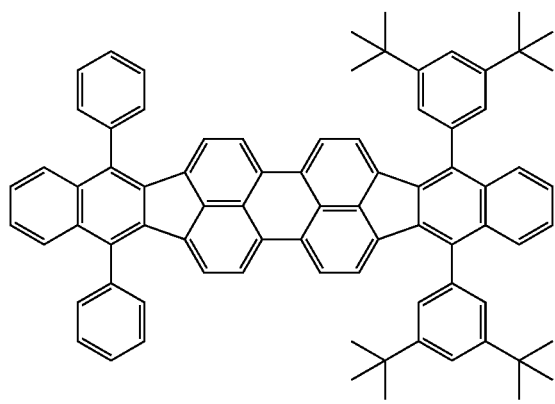
RD7
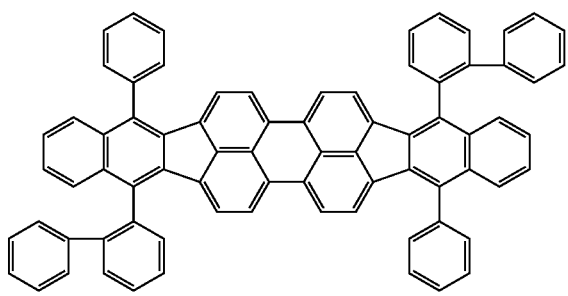
RD8
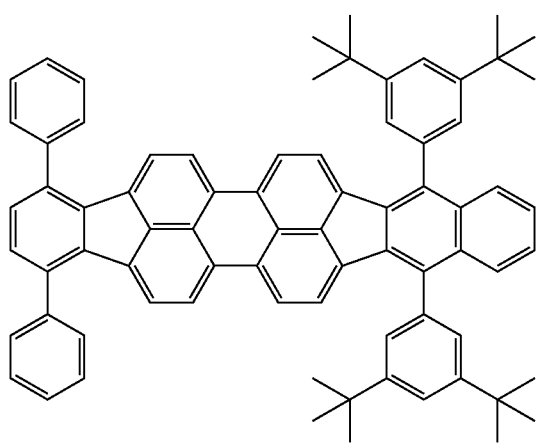
RD9
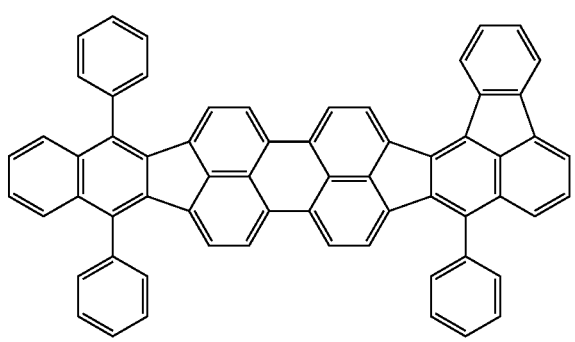
RD10
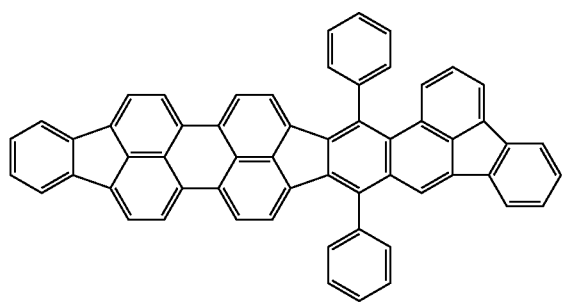
RD11
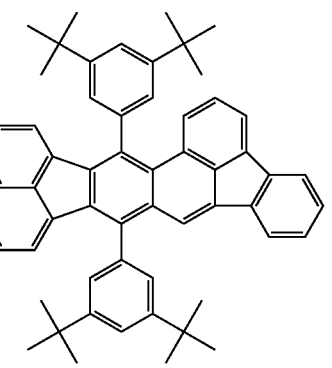
RD12
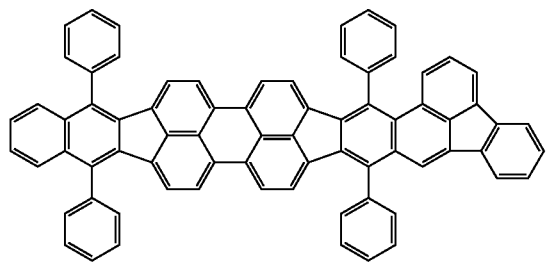
RD13
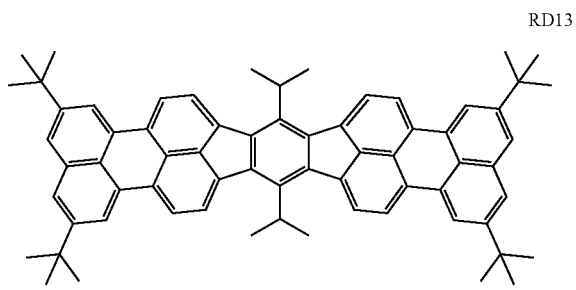

-continued
RD14
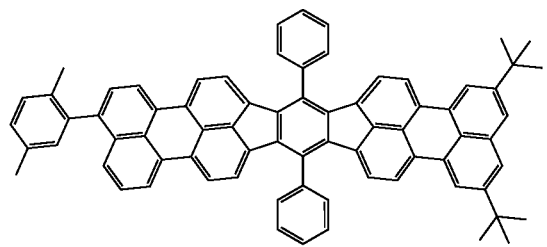
RD15
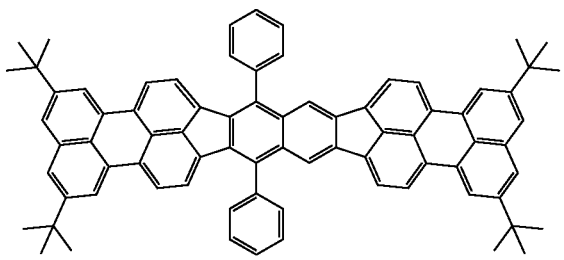
RD16
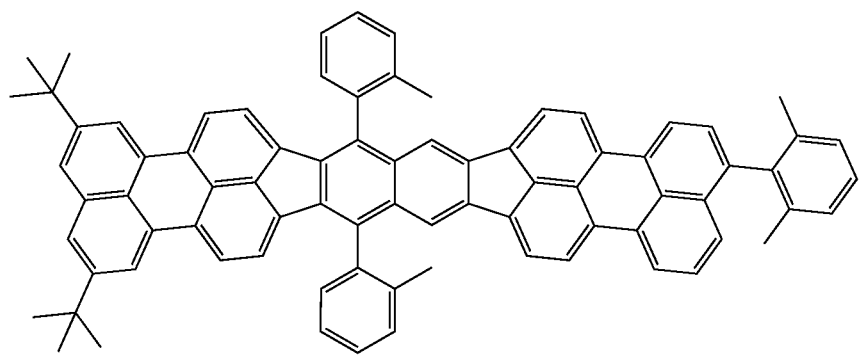
RD17
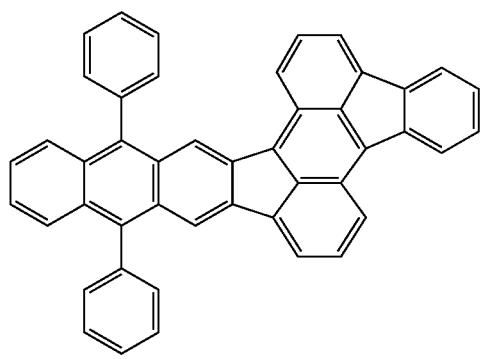
RD18
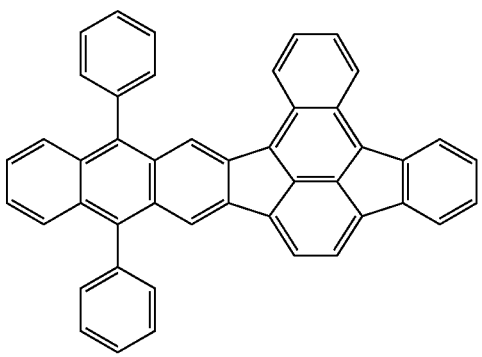
RD19
RD20
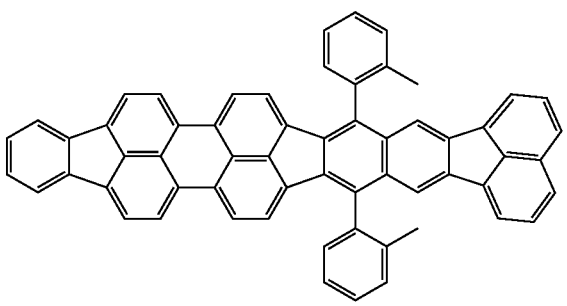

RD21

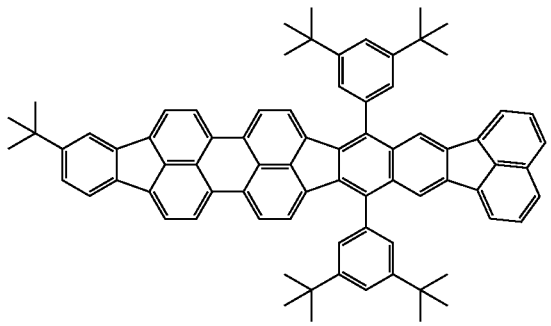

RD22

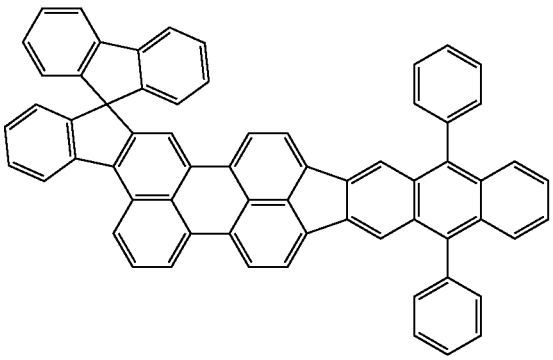

RD23

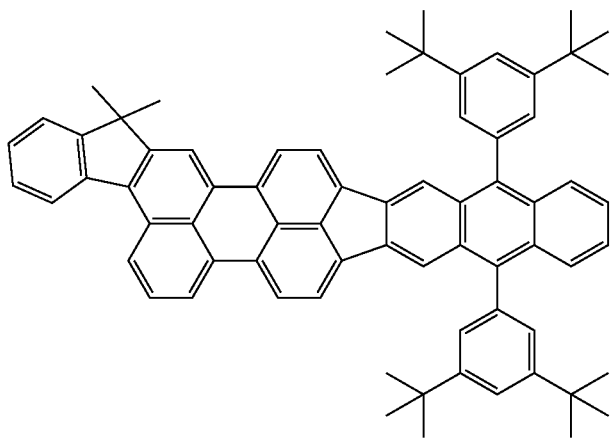

The RD 5 to 23 are hydrocarbon compounds and are desirable in order to achieve a long continuous drive lifetime. The RD5 can be synthesized by a synthesis method described in Japanese Patent Laid-Open No. 10-330295, the RD9 can be synthesized by a synthesis method described in Japanese Patent Laid-Open No. 2013-043846, the RD12 can be synthesized by a synthesis method described in Japanese Patent Laid-Open No. 2012-149012, the RD13 can be synthesized by a synthesis method described in Japanese Patent Laid-Open No. 2013-049663, and the RD20 can be synthesized by a synthesis method described in Japanese Patent Laid-Open No. 2013-139426. The synthesis methods described in the publications may be altered as appropriate considering the synthesis amount and the type of substituents provided in the basic skeleton. For example, a halogen atom to be used for a coupling reaction may be changed to a halogen atom of another type. In order to reduce the halogen used for the coupling reaction from an end product, a dehalogenation process may be provided. In a synthesis process, a boronic acid derivative and a pinacolboronate derivative to be used, a halogen type of a halogen substance, a Pd catalyst to be used for a Suzuki coupling reaction, and the like may be changed. Examples of the Pd catalyst to be changed include $(Pd(PPh_3)_4$, $Pd(PPh_3)_2Cl_2$, $Pd(OAc)_2$, $Pd(dba)_2$, $Pd(dba)_3$, and the like. Moreover. S-Phos, X-Phos, tri-o-tolylphosphine, tricyclohexyl phosphine, and the like may be added as a phosphorus ligand to the catalyst A triflate substance may be used in place of the halogen substance. Moreover, a Negishi coupling using organic zinc or a Stille Coupling using organic tin may be used in place of the Suzuki coupling.

As materials to be used for the hole injection layer, the hole transport layer 3, and the electron blocking layer of the organic light emitting element according to this embodiment, the following compounds can be mentioned, for example. The hole injection layer, the hole transport layer 3, and the electron blocking layer are organic compound layers disposed between the anode 2 and the light emitting layer 4. The LUMO of the electron blocking layer may be lower than that of the host of the light emitting layer.

Chem. 5
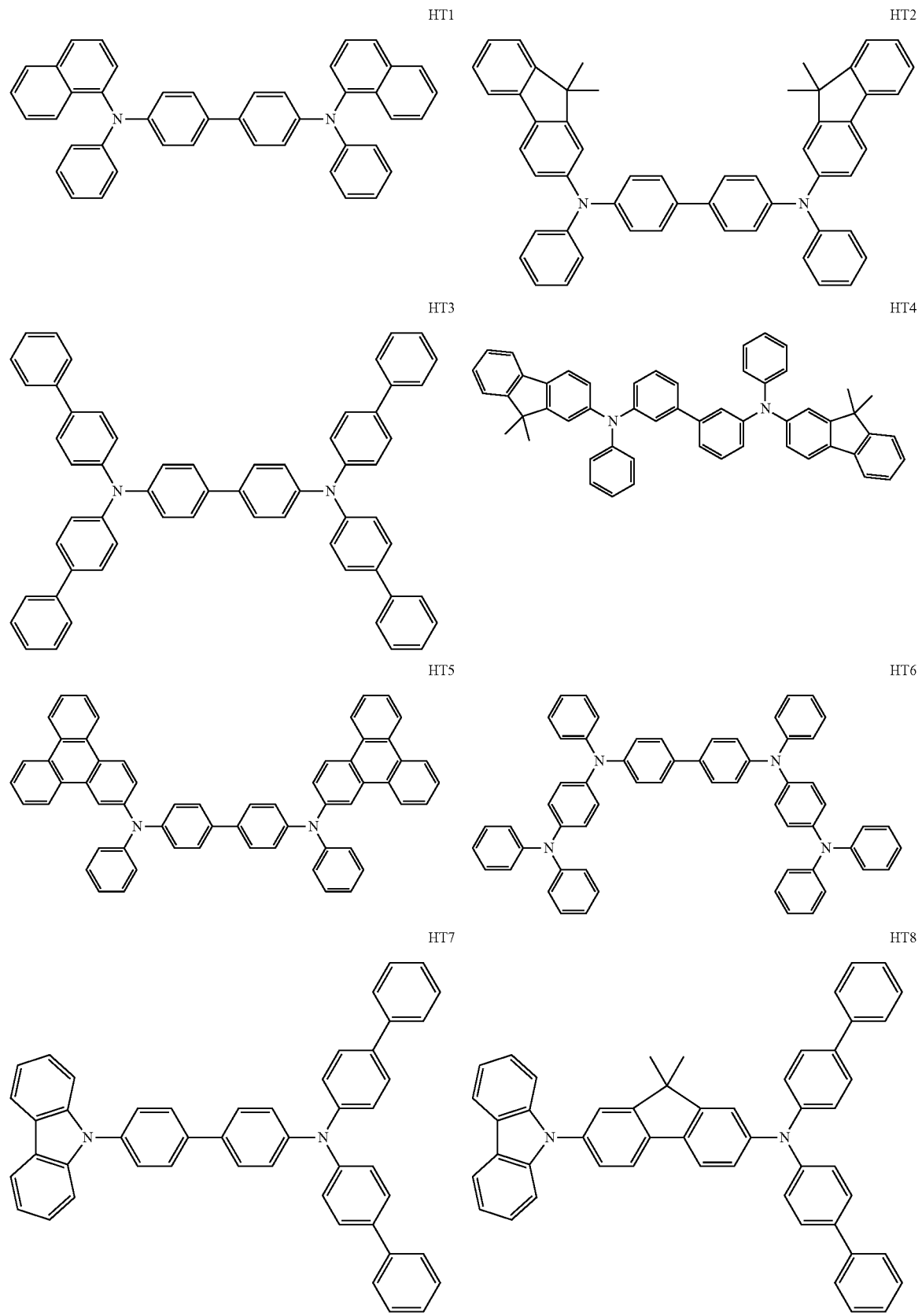

-continued
HT9
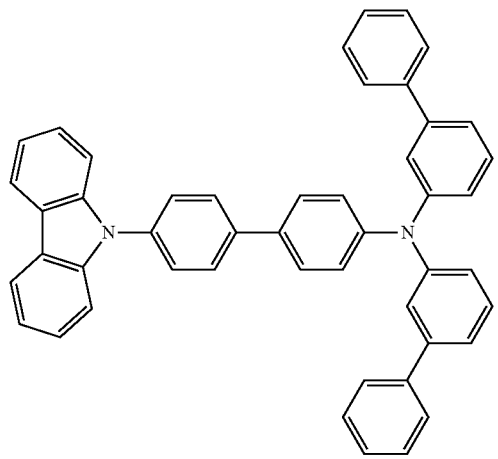
HT10
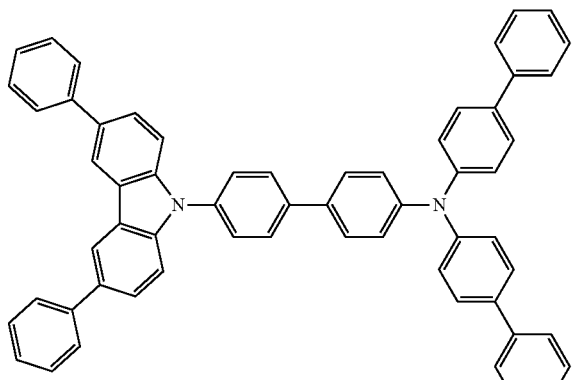
HT11
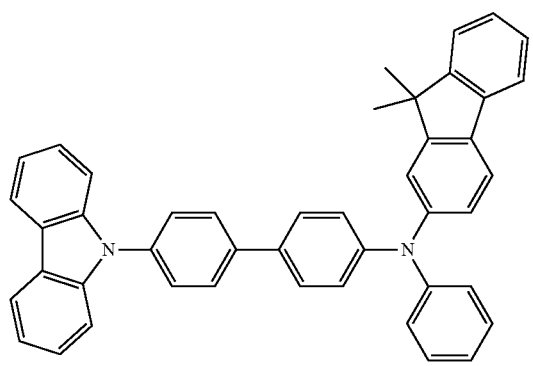
HT12
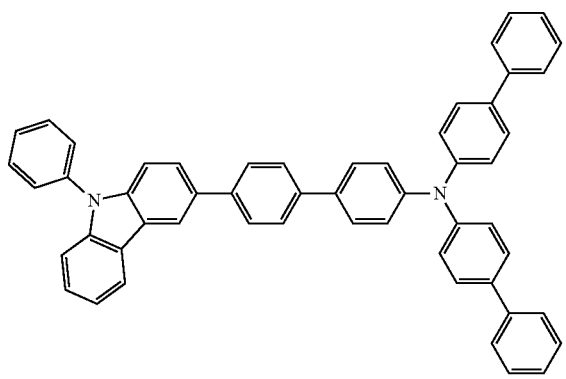
HT13
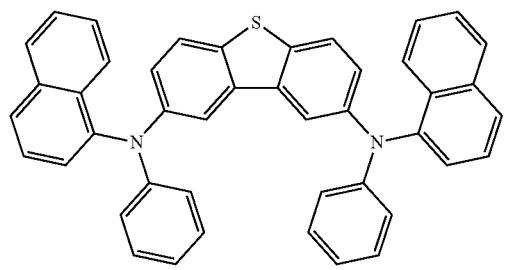
HT14
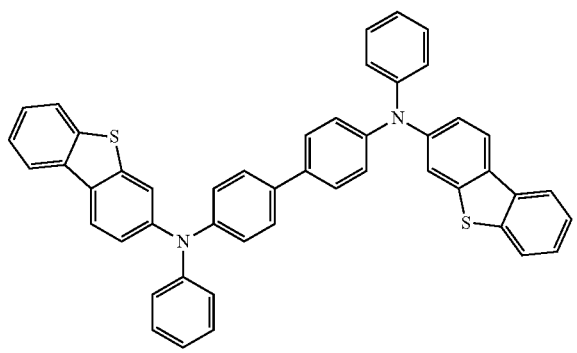
HT15
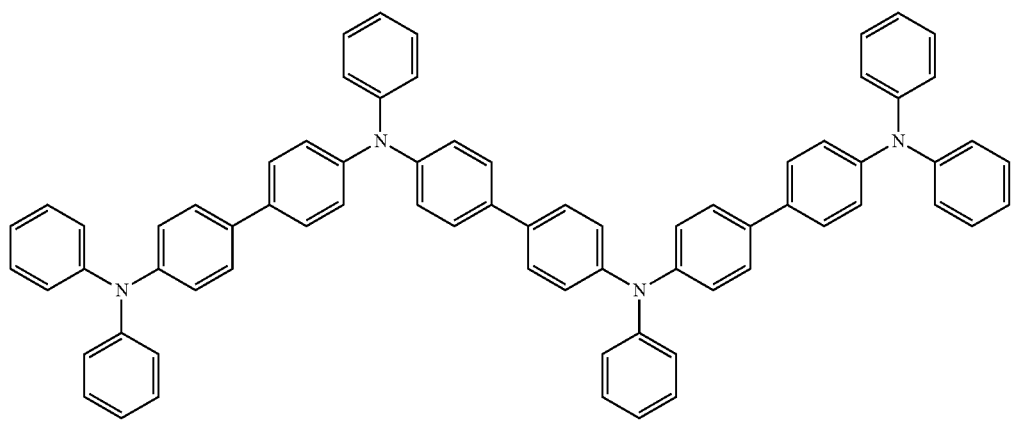

HT16

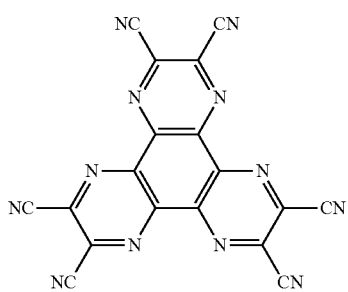

HT17

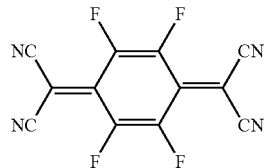

HT18

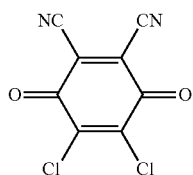

As materials to be used for the electron transport layer 6 and the hole blocking layer of the organic light emitting element according to this embodiment, the following compounds can be mentioned, for example. The electron transport layer 6 and the hole blocking layer are organic compound layers disposed between the cathode 7 and the light emitting layer 4. The HOMO of the hole blocking layer may be lower than that of the host of the light emitting layer.

Chem. 6

ET1

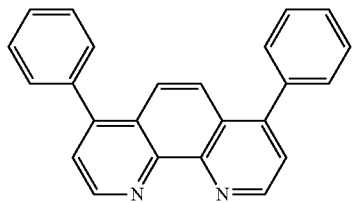

ET2

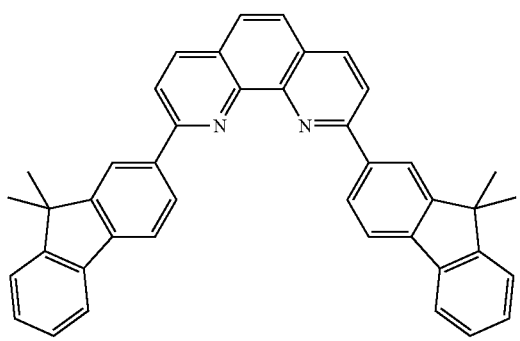

ET3

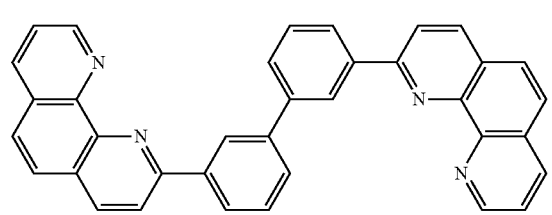

ET4

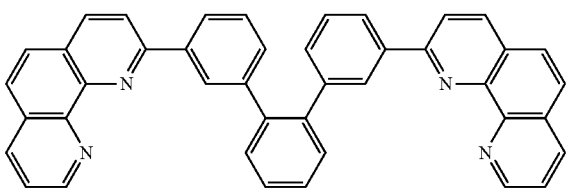

ET5

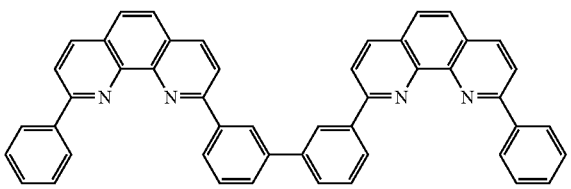

ET6

ET7

ET8
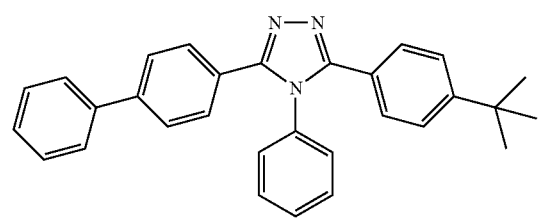
ET9
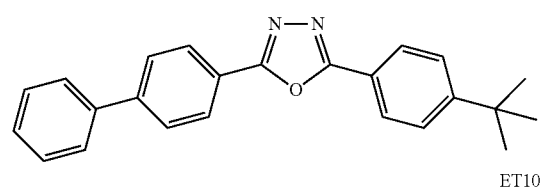
ET10
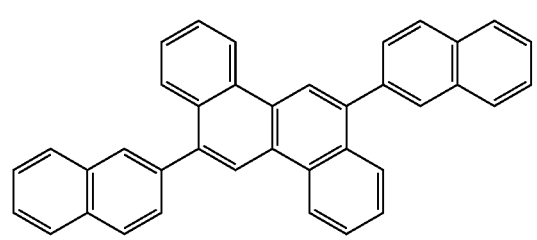
ET11
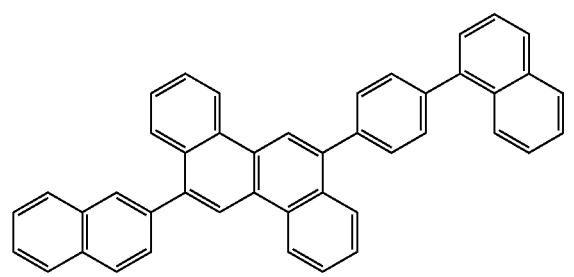
ET12
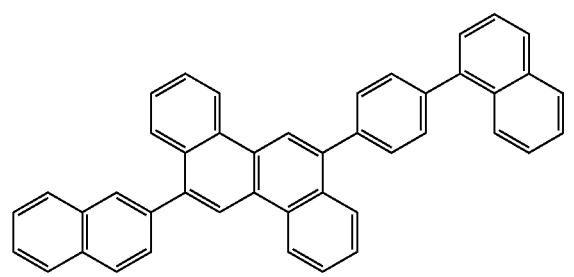
ET13
ET14
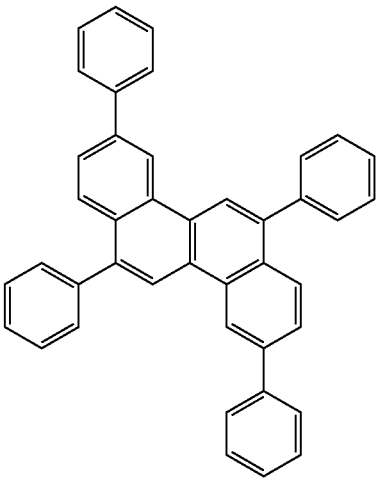
ET15
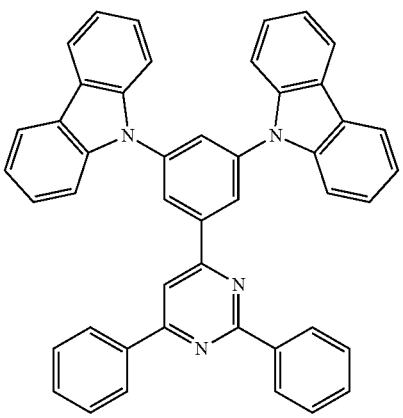
ET16
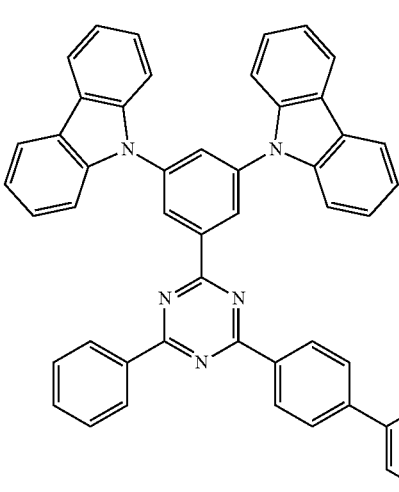

ET17
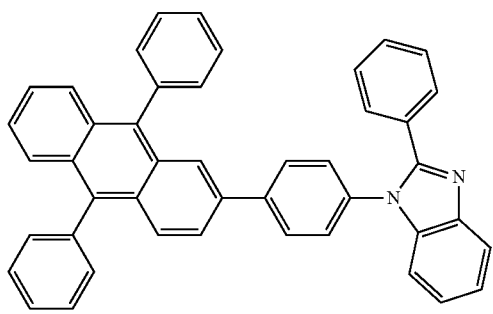

ET18
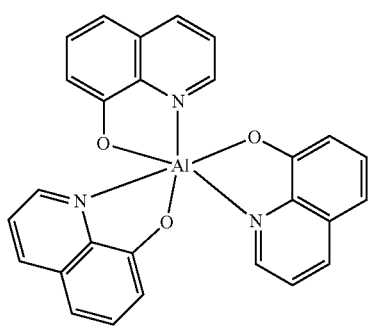

ET19
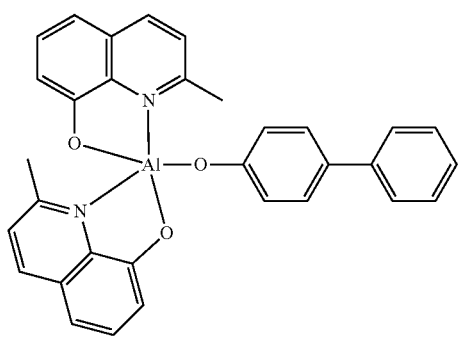

ET20
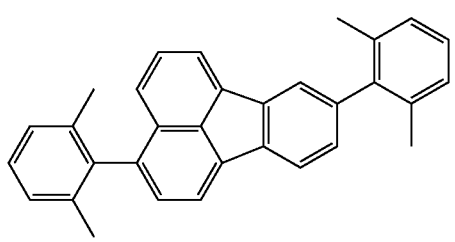

ET21
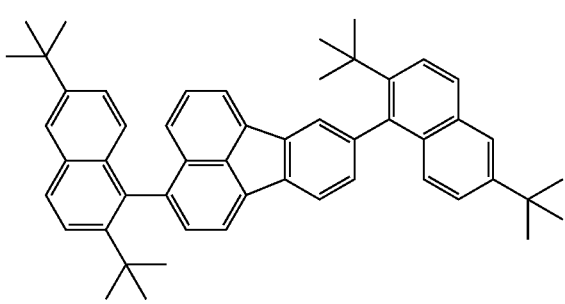

Materials configuring the hole blocking layer and the electron blocking layer to be used for the organic light emitting element according to this embodiment may have the lowest triplet excitation energy higher than that of the host material of the light emitting layer adjacent thereto. Thus, triplet excitons can be trapped in the light emitting layer, so that the TTA can be efficiently caused.

As the electron injection layer of the organic light emitting element according to this embodiment, a mixture of an electron donating dopant and an electron transporting material may be used. As the electron donating dopant, alkali metals, alkaline earth metals, rare earth metals, and compounds thereof are usable. The electron injection layer can be formed by compounding 0.1 wt % to 25 wt % of an alkali metal compound in the electron transporting material. Desirably, the alkali metal compound is a cesium compound. More desirably, the cesium compound is cesium carbonate and a substance derived from cesium carbonate. A suitable technique of forming the electron injection layer in the present invention is performing codeposition of the cesium carbonate and the electron transporting material. In order to secure a good electron injection property, the film thickness of the electron injection layer is preferably 10 nm to 100 nm. The cesium carbonate is decomposed, for example, in the codeposition, so that suboxides, such as $Cs(Cs_{11}O_3)_{10}$, $Cs(Cs_{11}O_3)$, and $Cs_{11}O_3$, derived from the cesium carbonate are formed in some cases in the electron injection layer. Moreover, a coordination compound may be formed between the cesium and the organic compound in some cases.

Protective Layer

A protective layer of the organic light emitting element according to this embodiment is configured from materials having excessively low permeability to oxygen or moisture from the outside such as silicon oxide and titanium oxide, for example, a silicon nitride (SiN) layer or a silicon oxynitride (SiON) layer formed using a chemical vapor deposition method (CVD method), an aluminum oxide layer formed using an atomic layer deposition method (ALD method) and may be a single layer or a multilayer insofar as the layer has sufficient moisture blocking performance. In the case of a multilayer, different materials may be laminated or the same material may be laminated while changing the density. The protective layer may be configured considering the refractive index so that the emission of the organic light emitting element is easily extracted to the outside of the apparatus. The protective layer can also be said to be a sealing layer.

Planarization Layer

A planarization layer of the organic light emitting element according to this embodiment is used for burying irregularities of the protective layer and may be disposed on the protective layer. Thus, scattered light generated by inclined portions of the irregularities of the protective film can be reduced and color mixing can be suppressed. The planarization layer can be configured from a resin layer or the like formed by coating. The planarization layer may be provided with arbitrary thickness and may be 10 nm or more and 1000 nm or less, for example.

Color Filter

A color filter of the organic light emitting element according to this embodiment may be formed by applying a color resist onto the planarization layer, and then performing patterning by lithography. The color filter may be provided on a counter substrate described later, and then bonding the same to the planarization layer. In this case, the planarization layer described above may be 10 nm or more and 1000 nm or less.

The color resist contains a photocurable resin, for example, and can form a pattern by curing of a portion irradiated with ultraviolet rays or the like.

In this embodiment, the color filter may have RGB color filters. The RGB color filters may be disposed in any of stripe arrangement, square arrangement, delta arrangement and Bayer arrangement.

A gap filling layer of the organic light emitting element according to this embodiment is disposed between the color filter and the counter substrate. The gap filling layer is configured by organic materials, such as an acrylic resin, an epoxy resin, and a silicon resin. A planarization layer may be formed between the color filter and the gap filling layer. The planarization layer may be the same as or may be different from the planarization layer disposed between the color filter and the protective layer. The two planarization layers may be formed of the same material because the adhesiveness of the planarization layers in the outside of a display region is high.

The outside of the display region refers to a region where an EL element is not disposed of an end portion of the substrate 1 and a region not contributing to display.

Counter Substrate

The counter substrate of the organic light emitting element according to this embodiment may be a transparent substrate. The counter substrate may be configured by a transparent glass substrate, the transparent plastic substrate, or the like, for example.

The organic light emitting element may have a binder resin. Examples of the binder resin include a polyvinyl carbazole resin, a polycarbonate resin, a polyester resin, an ABS resin, an acrylic resin, a polyimide resin, a phenol resin, an epoxy resin, a silicone resin, a urea resin, and the like. However, the binder resin is not limited thereto. The binder resins may be used alone or as a mixture of two or more kinds thereof as a homopolymer or a copolymer. Known additives, such as plasticizer, antioxidant, and ultraviolet absorber, may be used in combination as necessary.

Intended Use of Organic Light Emitting Element According to One Embodiment of Present Invention The organic light emitting element according to this embodiment can be used as a constituent member of a display apparatus or an illumination apparatus. In addition thereto, the organic light emitting element is used for an exposure light source of an electrophotographic image forming apparatus, a back light of a liquid crystal display, a light emitting apparatus having a color filter in a white light source, and the like.

The display apparatus may be an image information processing apparatus having an image input portion inputting image information from an area CCD, a linear CCD, a memory card, or the like and an information processing portion processing the input information and displaying the input image on a display section.

A display section provided in an image pickup apparatus and an ink jet printer may have a touch panel function. A drive system of the touch panel function may be an infrared system, an electrostatic capacitance system, a resistance film system, or an electromagnetic induction system and is not particularly limited. The display apparatus may be used for a display section of a multifunction printer.

Figure 5:
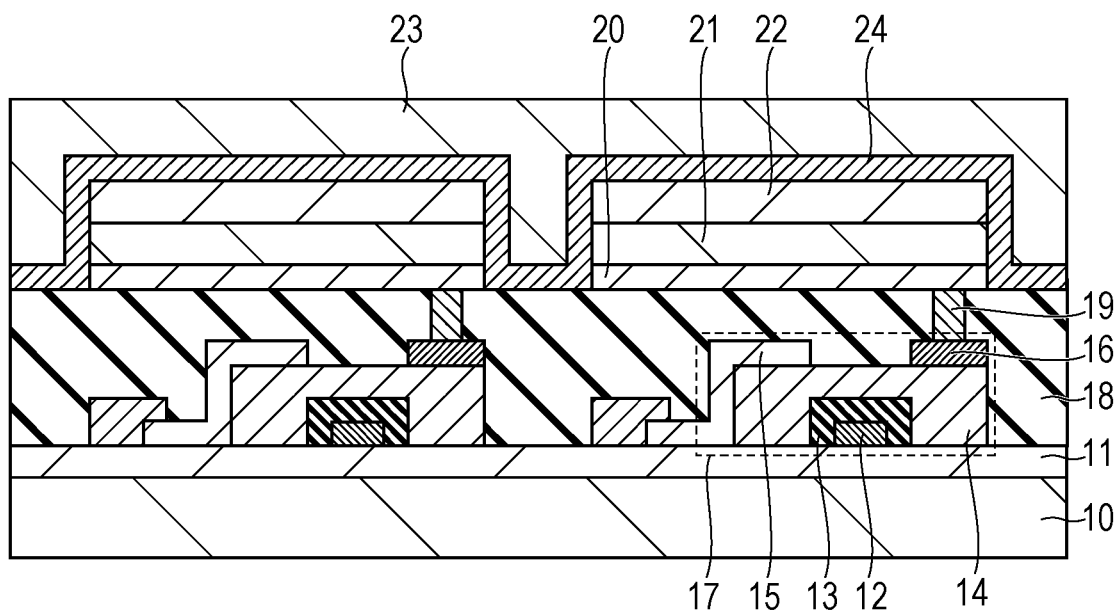
FIG. 5 is a schematic cross-sectional view of an example of a display apparatus using an organic light emitting element according to one embodiment of the present invention.

Next, a display apparatus according to this embodiment is described with reference to the drawings. FIG. 5 is a cross-sectional schematic view illustrating an example of a display apparatus having an organic light emitting element and a TFT element connected to the organic light emitting element. The TFT element is an example of an active element.

A display apparatus 30 of FIG. 5 is provided with a substrate 10 of glass or the like and a moisture-proof film 11 for protecting a TFT element 17 or an organic compound layer 21 on the substrate 10. The reference numeral 12 denotes a metal gate electrode 12. The reference numeral 13 denotes a gate insulating film 13 and 14 denotes a semiconductor layer.

The TFT element 17 has the semiconductor layer 14, a drain electrode 15, and a source electrode 16. An insulating film 18 is provided on the TFT element 17. An anode 20 configuring an organic light emitting element and the source electrode 16 are connected through a contact hole 19.

An electrical connection system between electrodes (anode, cathode) contained in the organic light emitting element and the electrodes (source electrode, drain electrode) contained in the TFT is not limited to the aspect illustrated in FIG. 5. More specifically, either the anode or the cathode and either the source electrode or the drain electrode of the TFT element may be electrically connected.

Although the organic compound layer 21 is illustrated as one layer in the display apparatus 30 of FIG. 5, the organic compound layers 21 may be a multilayer. On a cathode 22, a first protective layer 24 and a second protective layer 23 for suppressing deterioration of the organic light emitting element are provided.

Although a transistor is used as a switching element in the display apparatus 30 of FIG. 5, an MIM element may be used as a switching element in place thereof.

The transistor to be used for the display apparatus 30 of FIG. 5 is not limited to a transistor using a single crystal silicon wafer and may be a thin film transistor having an active layer on an insulating surface of a substrate. Examples of the active layer include single crystal silicon, non-single crystal silicon, such as amorphous silicon and microcrystalline silicon, and non-single crystal oxide semiconductors, such as an indium zinc oxide and indium gallium zinc oxide. The thin film transistor is also referred to as a TFT element.

The transistor contained in the display apparatus 30 of FIG. 5 may be formed in a substrate, such as an Si substrate. Herein, the description "formed in a substrate" means processing the substrate itself, such as the Si substrate, to produce a transistor. More specifically, the description "having the transistor in the substrate" can also be regarded that the substrate and the transistor are integrally formed.

In the organic light emitting element according to this embodiment, the emission luminance is controlled by the TFT which is an example of the switching element. By providing two or more of the organic light emitting elements in a plurality of surfaces, images can be displayed at each emission luminance. The switching element according to this embodiment is not limited to the TFT and may be a transistor formed of low-temperature polysilicon or an active-matrix driver formed on the substrate, such as the Si substrate. The description "on the substrate" can also be said to be the inside of the substrate. It is selected based on the size of the display section whether the transistor is provided in the substrate or the TFT is used. For example, in the case of the size of approximately 0.5 inch, the organic light emitting element may be provided on the Si substrate.

Figure 7:
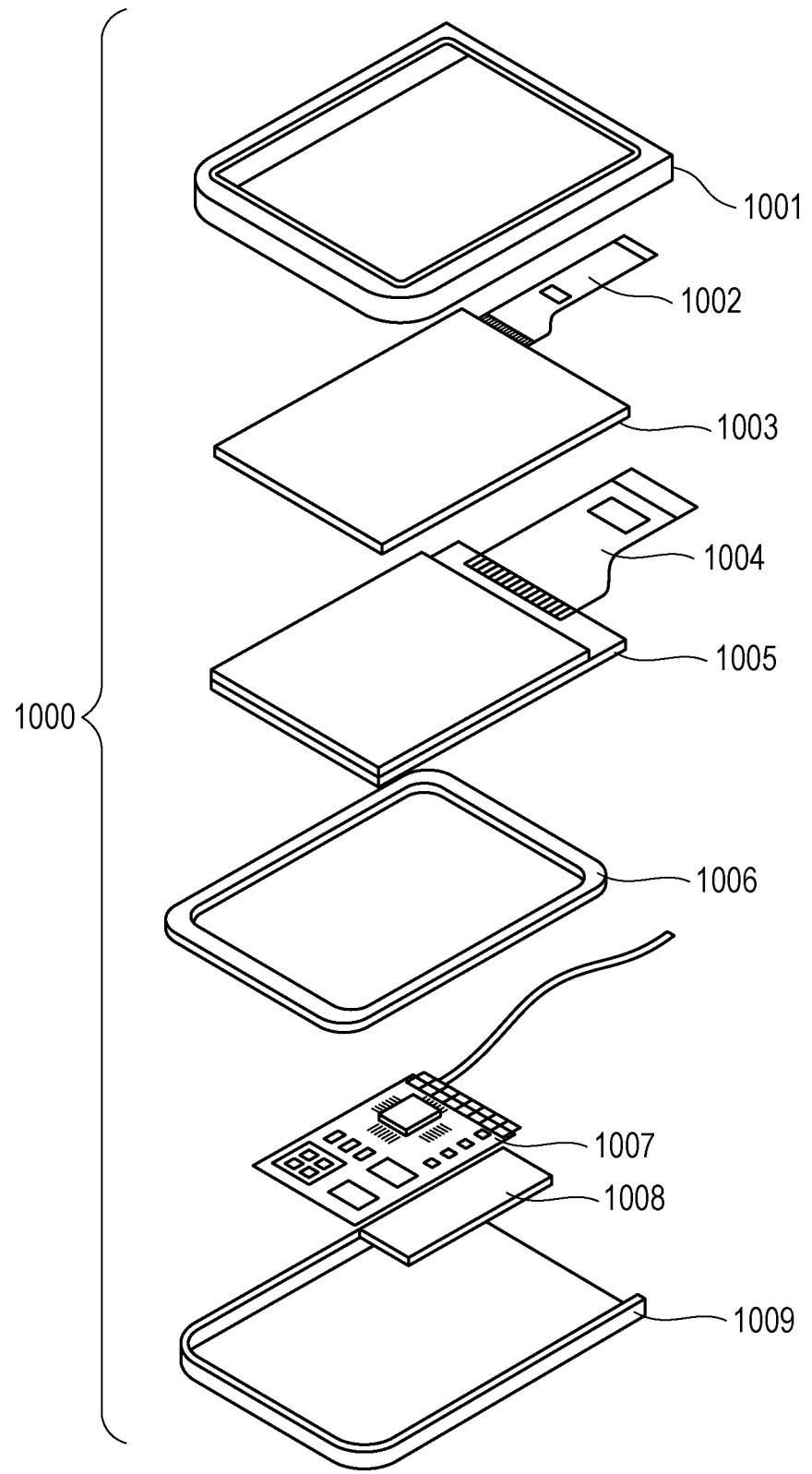
FIG. 7 is a schematic view illustrating an example of a display apparatus according to one embodiment of the present invention.

FIG. 7 is a schematic view illustrating an example of a display apparatus according to this embodiment. A display apparatus 1000 may have a touch panel 1003, a display panel 1005, a frame 1006, a circuit board 1007, and a battery 1008 between an upper cover 1001 and a lower cover 1009. To the touch panel 1003 and the display panel 1005, flexible printed circuits FPC 1002 and 1004 are connected, respectively. On the circuit board 1007, a transistor is printed. The battery 1008 may not be provided when the display apparatus 1000 is not a portable device and, even in the case of a portable device, may be formed at another position.

The display apparatus according to this embodiment may be used for a display section of an image pickup apparatus having an optical section having a plurality of lenses and an image pickup element receiving light passing through the optical section. The image pickup apparatus may have a display section displaying information acquired by the image pickup element. The display section may be a display section exposed to the outside of the image pickup apparatus or may be a display section disposed in a finder. The image pickup apparatus may be a digital camera or a digital video camera.

Figure 8A:
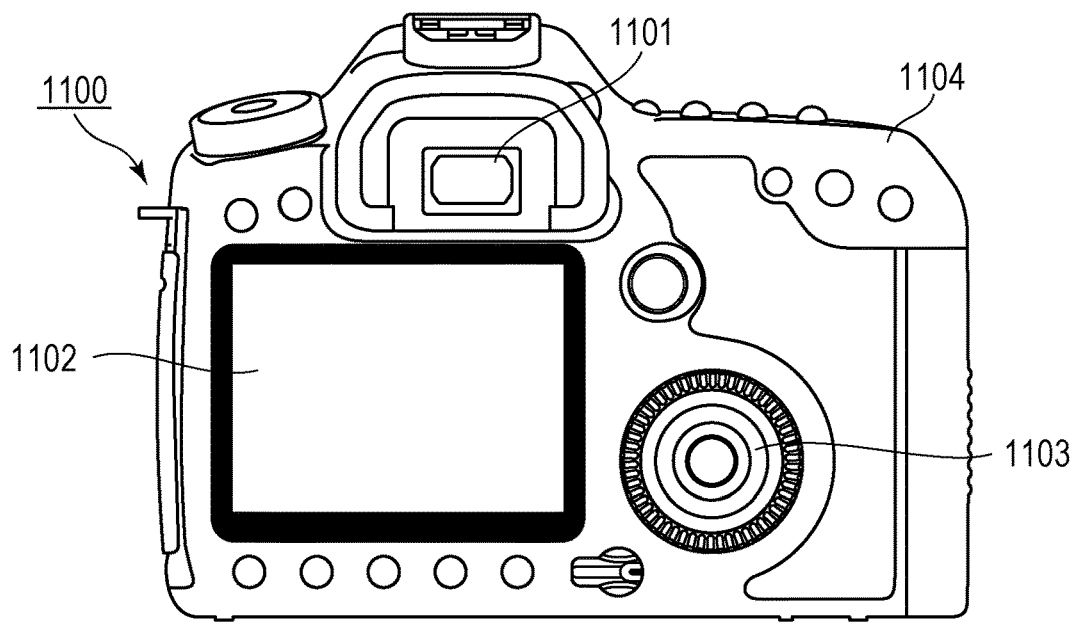
FIG. 8A is a schematic view illustrating an example of an image pickup apparatus according to one embodiment of the present invention.

FIG. 8A is a schematic view illustrating an example of an image pickup apparatus according to this embodiment. An image pickup apparatus 1100 may have a view finder 1101, a rear display 1102, an operation portion 1103, and a housing 1104. The view finder 1101 may have the display apparatus according to this embodiment. In that case, the display apparatus may display not only an image to be picked up but environmental information, image pick-up directions, and the like. The environmental information may be the intensity of outside light, the direction of outside light, the moving speed of a subject, the possibility that a subject is shielded with a shielding object, and the like.

The timing suitable for image pick-up is very short time, and therefore it is desirable to display information as quickly as possible. Therefore, the display apparatus using the organic light emitting element of the present invention may be used. This is because the speed of response of the organic light emitting element is high. The display apparatus using the organic light emitting element is desirably used compared to the apparatuses and a liquid crystal display which are required to have a high display speed.

An image pickup apparatus 1100 has an optical section which is not illustrated. The optical section has a plurality of lenses and forms an image in an image pickup element accommodated in a housing 1104. The plurality of lenses can adjust the focus by adjusting the relative position. This operation can also be automatically performed.

The display apparatus according to this embodiment may have a color filter having a red color, a green color, and a blue color. In the color filter, the red color, the green color, and the blue color may be disposed in the delta arrangement.

The display apparatus according to this embodiment may be used for a display section of a mobile terminal. In that case, the display apparatus may have both a display function and an operation function. Examples of the mobile terminal include cellular phones, such as a smartphone, a tablet, a head mounted display, and the like.

Figure 8B:
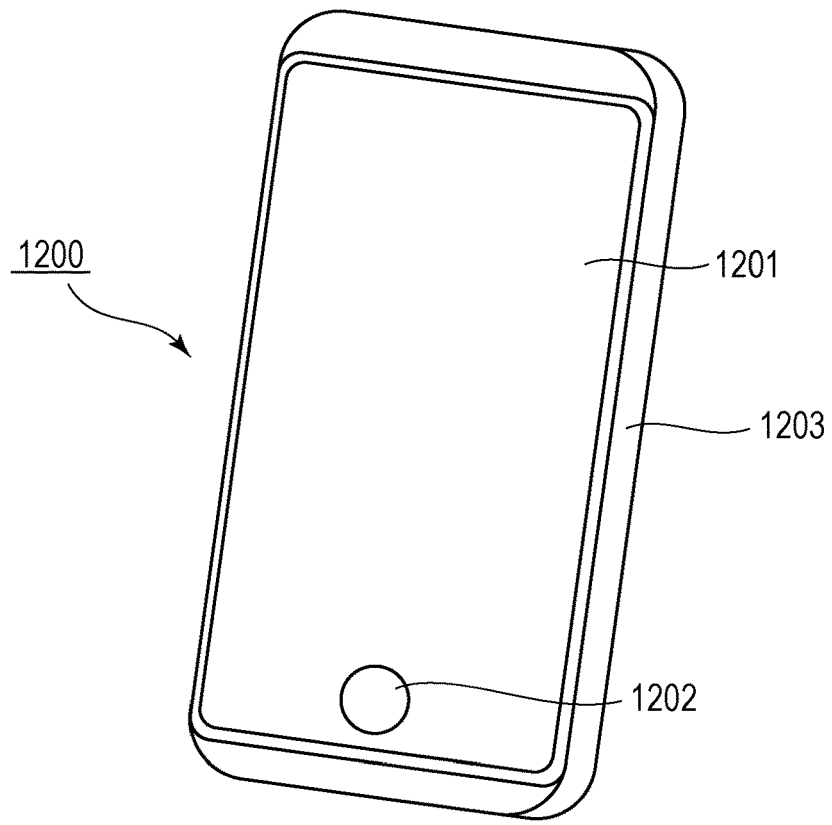
FIG. 8B is a schematic view illustrating an example of electronic equipment according to one embodiment of the present invention.

FIG. 8B is a schematic view illustrating an example of electronic equipment according to this embodiment. Electronic equipment 1200 has a display section 1201, an operation portion 1202, and a housing 1203. The housing 1203 may have a circuit, a printed circuit board having the circuit, a battery, and a communication section. The operation portion 1202 may be a button or may be a reaction portion of a touch panel system. The operation portion 1202 may be a living body recognition portion recognizing a fingerprint to perform unlocking, for example. The electronic equipment having the communication section can also be said to be communication equipment.

Figure 9A:
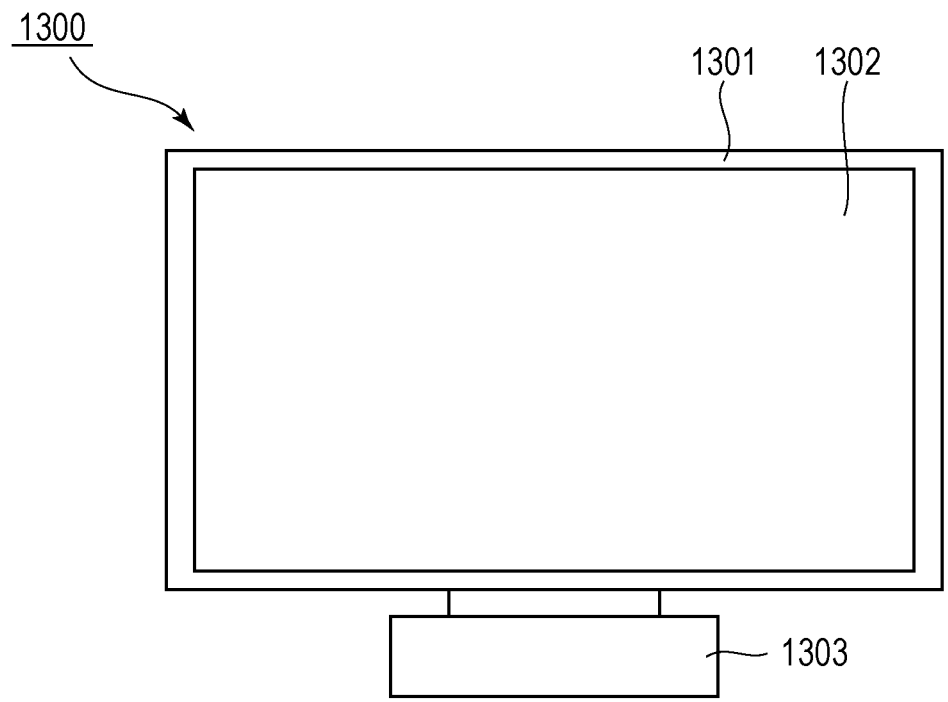
FIG. 9A is a schematic view illustrating an example of a display apparatus according to one embodiment of the present invention.
Figure 9B:
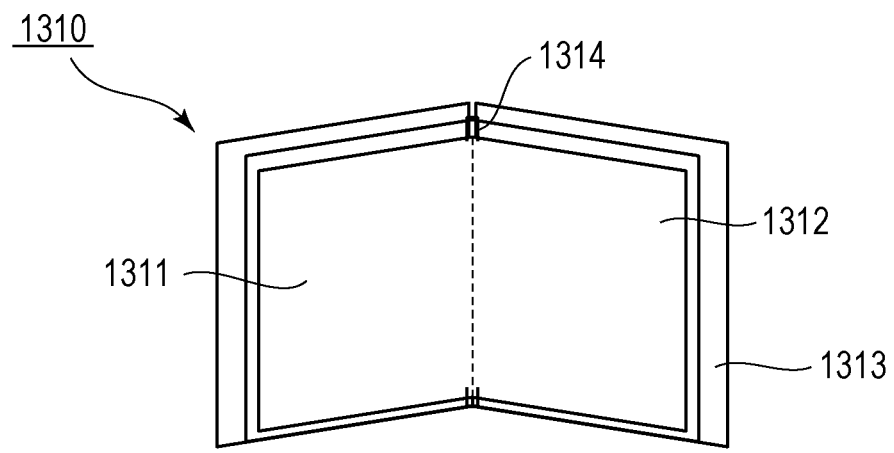
FIG. 9B is a schematic view illustrating an example of a foldable display apparatus.

FIGS. 9A and 9B are schematic views illustrating an example of the display apparatus according to this embodiment. FIG. 9A illustrates a display apparatus, such as a television monitor or a PC monitor. A display apparatus 1300 has a frame 1301 and a display section 1302. For the display section 1302, a light emitting apparatus according to this embodiment may be used.

The frame 1301 and a foundation 1303 supporting the display section 1302 are provided. The foundation 1303 is not limited to the form of FIG. 9A. The lower side of the frame 1301 may serve as the foundation.

The frame 1301 and the display section 1302 may be curved. The curvature radius may be 5000 mm or more and 6000 mm or less.

FIG. 9B is a schematic view illustrating another example of the display apparatus according to this embodiment. A display apparatus 1310 of FIG. 9B is configured to be foldable and is a so-called foldable display device. The display apparatus 1310 has a first display section 1311, a second display section 1312, a housing 1313, and a bending point 1314. The first display section 1311 and the second display section 1312 may have the light emitting apparatus according to this embodiment. The first display section 1311 and the second display section 1312 may be a display apparatus of one sheet without a joint. The first display section 1311 and the second display section 1312 can be divided at the bending point 1314. The first display section 1311 and the second display section 1312 may individually display different images or may display one image by the first and second display sections.

Figure 10A:
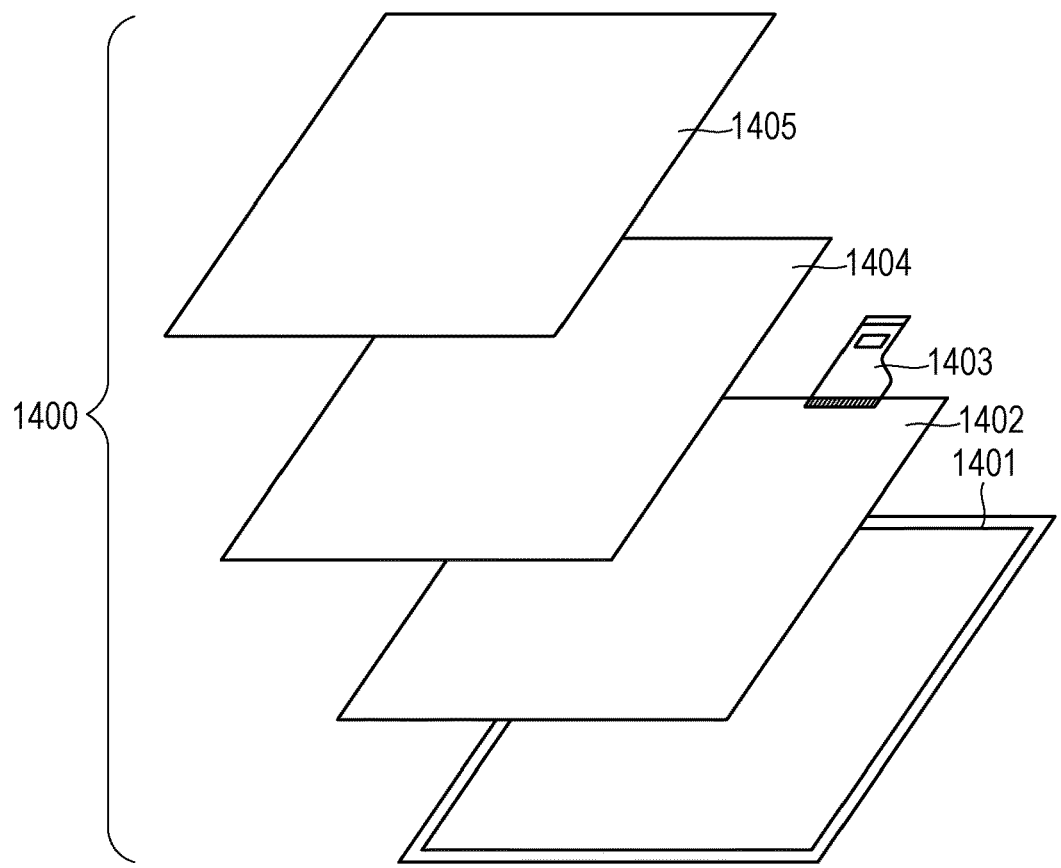
FIG. 10A is a schematic view illustrating an example of an illumination apparatus according to one embodiment of the present invention.

FIG. 10A is a schematic view illustrating an example of an illumination apparatus according to this embodiment. An illumination apparatus 1400 may have a housing 1401, a light source 1402, a circuit board 1403, an optical film 1404, and a light diffusion section 1405. The light source 1402 may have the organic light emitting element according to this embodiment. An optical filter may be a filter increasing the color rendering properties of the light source 1402. The light diffusion section 1405 can effectively diffuse light of the light source 1402 to send light in a wide range, such as light-up. The optical filter and the light diffusion section 1405 may be provided on the illumination light emitting side. A cover may be provided in the outermost portion as necessary.

The illumination apparatus is an apparatus illuminating the inside of a room. The illumination apparatus may emit light of any of white color and daytime white color, and, in addition thereto, blue color and red color. A light control circuit of controlling the light may be provided. The illumination apparatus may have the organic light emitting element according to one embodiment of the present invention and a power supply circuit connected thereto. The power supply circuit is a circuit converting an AC voltage to a DC voltage. The white has a color temperature of 4200 K. The daytime white color has a color temperature of 5000 K. The illumination apparatus may have a color filter.

The illumination apparatus according to this embodiment may have a heat dissipation portion. The heat dissipation portion emits heat in the apparatus to the outside of the apparatus and metal, liquid silicon, and the like having high specific heat are mentioned.

Figure 10B:
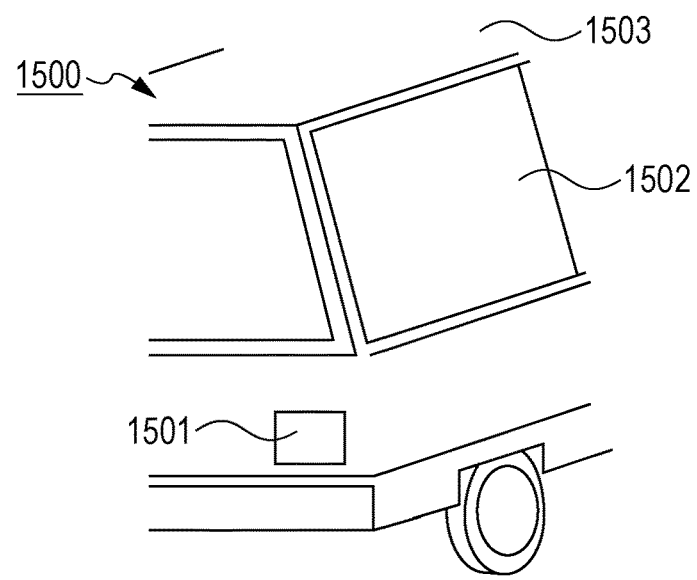
FIG. 10B is a schematic view illustrating an example of an automobile having a vehicle illumination tool according to one embodiment of the present invention.

FIG. 10B is a schematic view of an automobile which is an example of a moving body according to this embodiment. The automobile has a tail lamp which is an example of a lighting tool. An automobile 1500 has a tail lamp 1501 and may have an aspect of turning on the tail lamp 1501 in performing a brake operation, for example.

The tail lamp 1501 may have the organic light emitting element according to this embodiment. The tail lamp 1501 may have a protection member protecting an organic EL element. A material of the protection member is not limited insofar as the material has high intensity to some extent and is transparent. The protection member may contain polycarbonate and the like. A furandicarboxylic acid derivative, an acrylonitrile derivative, and the like may be mixed with polycarbonate.

The automobile 1500 may have a body 1503 and a window 1502 attached thereto. The window may be a transparent display when the window is not used for checking the front and the rear of the automobile 1500. The transparent display may have the organic light emitting element according to this embodiment. In this case, constituent materials, such as an electrode, provided in the organic light emitting element contain transparent members.

The moving body according to this embodiment may be a vessel, an airplane, a drone, or the like. The moving body may have a body and a lighting tool provided in the body. The lighting tool may emit light for notifying the position of the body. The lighting tool has the organic light emitting element according to this embodiment.

As described above, a display which has good image quality and is stable even when the display is performed over a long period of time is achieved by the use of an apparatus using the organic light emitting element according to this embodiment.

EXAMPLES

Example 1

Hereinafter, a procedure of producing an organic light emitting element of a top emission type structure illustrated in FIG. 1 is described.

On a substrate, Ti was formed into a 40 nm film by a sputtering method, and then patterned using a known photolithographic technique to form an anode. At this time, the electrode area of electrodes (metal electrode layer, cathode) facing each other was set to 3 mm$^2$.

Subsequently, the substrate which was cleaned and on which the electrodes were formed and on which materials were attached, was placed in a vacuum evaporation device (manufactured by Ulvac, Inc.), where exhaust is performed up to 1.33×10$^{-4}$ Pa (1×10$^{-6}$ Torr), and then UV/ozone cleaning was performed. Thereafter, the film formation of each layer was performed with the following layer configurations.

a 10 nm film as a cathode. The ratio of Mg to Ag was set to 1:1. Thereafter, SiN were formed into a 1.5 μm film as a sealing layer by a CVD method.

Meanwhile, the lowest triplet excitation energies of a host and a dopant of each light emitting layer were acquired. Since a material from which the emission of phosphorescence cannot be observed by the measuring method described above was contained, the calculation techniques described above were unified to obtain the lowest triplet excitation energy of each compound.

The lowest excitation triplet exciton energies of the EM1 which is a material of first and second hosts, the RD21 of a red light emitting material which is a first dopant, the BD24 of a blue light emitting material which is a material of a second dopant, and the GD11 of a green light emitting material which is a third dopant were T1(H1)=T1(H2)=2.04 eV, T1(D1)=1.24 eV, T1(D2)=2.15 eV, and T1(D3)=1.88 eV, respectively. Therefore, the relationships of the following expressions (1), (4), and (5) are satisfied.

$$T1(H1)-T1(D1) \geq 0.3 \text{ eV} \tag{1}$$

$$T1(H2) \leq T1(D2) \tag{4}$$

$$0 \text{ eV} < T1(H1)-T1(D3) < 0.3 \text{ eV} \tag{5}$$

The first and second hosts contain the same material and the first and second light emitting layers are adjacent to each other, and therefore a movement path of triplet excitons from the first light emitting layer to the second light emitting layer is provided.

Furthermore, the lowest singlet excitation energies of the host and the dopant of each light emitting layer were obtained by the calculation technique described above. The lowest singlet excitation energies of the EM1 which is a material of the first and second hosts, the RD21 of a red light emitting material which is the first dopant, the BD24 of a blue light emitting material which is a material of the second dopant, and the GD11 of a green light emitting material which is the third dopant were S1(H1)=S1(H2)=3.15 eV, S1(D1)=2.13 eV, S1(D2)=2.98 eV, and S1(D3)=2.67 eV, respectively.

A difference between the lowest singlet excitation energy and the lowest triplet excitation energy of each compound is 0.2 eV or more and the compound is not a delayed fluorescent compound.

TABLE 1

| | | | Material | Film thickness (nm) |
|---|---|---|---|---|
| Hole injection layer (HIL) | | | HT16 | 7 |
| Hole transport layer (HTL) | | | H2 | 10 |
| Electron blocking layer (EBL) | | | H8 | 10 |
| First light emitting layer | First host | EM1 | Mass ratio EM1:GD11:RD21 97.7:2.0:0.3 | 10 |
| | Third dopant (Green light emitting material) | GD11 | | |
| | First dopant (Red light emitting material) | RD21 | | |
| Second light emitting layer | Second host | EM1 | Mass ratio EM1:BD24 = 99.4:0.6 | 10 |
| | Second dopant (Blue light emitting material) | BD24 | | |
| Hole blocking layer (HBL) | | | ET13 | 15 |
| Electron transport layer (ETL) | | | ET2 | 25 |

Then, an electron transport layer was formed, and then lithium fluoride was formed into a 0.5 nm film as an electron injection layer. Thereafter, an MgAg alloy was formed into A voltage application apparatus which is not illustrated was connected to the obtained organic white light emitting element, and then the characteristics thereof were evaluated.

The current-voltage characteristics were measured with a microammeter 4140B manufactured by Hewlett-Packard Company and the evaluation of the chromaticity was performed using "SR-3" manufactured by TOPCON CORP. The emission luminance was measured with BM7 manufactured by TOPCON CORP. The efficiency, voltage, and CIE chromaticity coordinates in the u'v' space when displayed at 1000 cd/m² were 4.0 cd/A, 4.0 V, and CIE(u',v')=(0.196, 0.386), respectively. Herein, a color difference amount Δu'v' given by the following expression (6) to the CIE chromaticity coordinates (0.198, 0.468) in the u'v' space of white light having a color temperature of 6400 K which is a reference was 0.047 and a good organic light emitting element was obtained.

$$\Delta u'v' = \sqrt{(0.198-u')^2 + (0.468-v')^2} \tag{6}$$

When a continuous drive test at the initial luminance of 4000 cd/m² was performed, the luminance half time was 3500 h, and thus the durability characteristic was also good.

Next, with respect to the TTA emission ratio of the obtained white element, the emission derived from the red light emitting material, the emission derived from the green light emitting material, and the emission derived from the blue light emitting material were individually measured.

The TTA emission ratio was determined by performing the transient response measurement, and then analyzing the measurement result.

The transient response measurement is performed by applying a rectangular wave voltage to an organic light emitting element with a voltage pulse generator, and then performing time-resolved detection of the emission intensity from the organic light emitting element with an oscilloscope through a photomultiplier while synchronizing with the voltage. Specifically, a positive voltage having a desired current density is applied to the organic light emitting element over a period of time sufficient for the emission intensity to enter a steady state. Thereafter, a negative voltage is applied in order to discharge charges from the element.

In this example, 33250A manufactured by Agilent was used as the voltage pulse generator. As the rectangular wave voltage, the frequency was 100 Hz, a positive voltage equivalent to approximately 10 mA/cm² was applied at a pulse width of 1 ms, and a negative voltage of −10 V was applied. For the oscilloscope, TDS5054 manufactured by Tektronix was used.

Figure 6A:
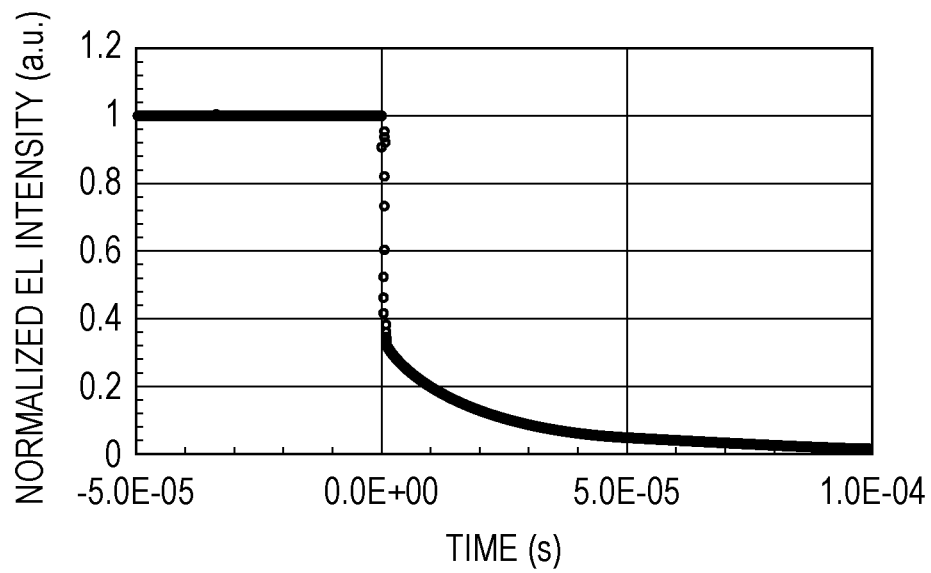
FIGS. 6A and 6B are figures illustrating data analysis results of the TTA emission ratio.

FIG. 6A illustrates an example of the transient response measurement result and illustrates a change with time of the obtained emission intensity synchronized with the voltage. At 0 s, the voltage is switched from a positive voltage to a negative voltage and the emission intensity in a steady state in the application of the positive voltage is set to 1.

The contents of the emission intensity in the positive voltage application are the total of the emission from singlet excitons generated by the recombination of charges and the emission from singlet excitons generated by the TA.

On the other hand, the emission by the TTA is observed in the negative voltage application. The observed emission has the transient response characteristic. The analysis of the transient response characteristic of the emission by the TTA determines the TTA emission ratio.

It is known that, when the transient response characteristic of the emission in the negative voltage application is based on the TTA, the reciprocal of the square root of the emission intensity can be expressed by linear approximation.

Figure 6B:
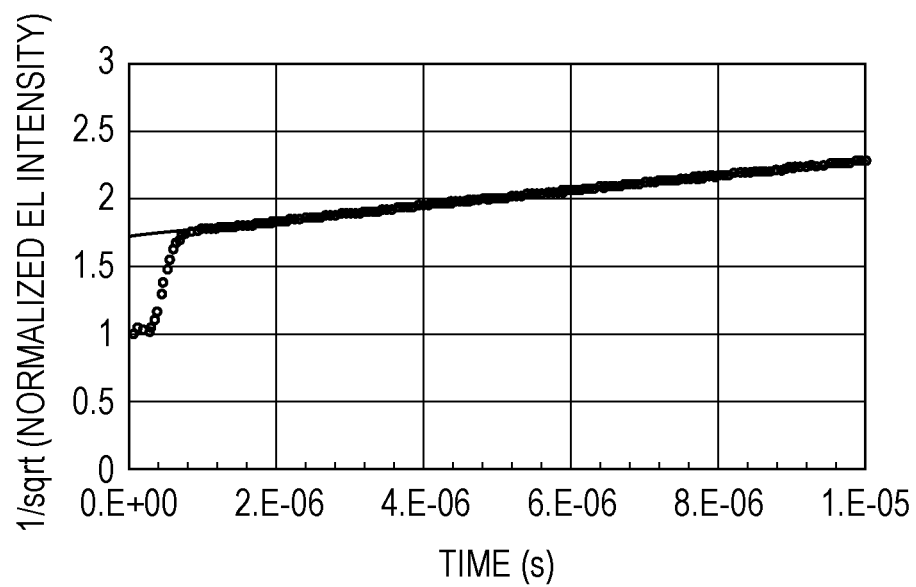

Then, as illustrated in FIG. 6B, the change with time of the reciprocal of the square root of the emission intensity is plotted, and then the transient response characteristic is fitted by Expression 2 to determine a constant B. In Expression (7). $I_{TTA}$ expresses the emission intensity in the negative voltage application and A and B express the constants, and t expresses time.

$$\frac{1}{\sqrt{I_{TTA}}} = At + B \tag{7}$$

At this time, emission intensity $1/B^2$ at the time t=0 when the voltage is switched from the positive voltage to the negative voltage is defined as the ratio of the emission by the TTA to all the emissions. For example, B is 1.72 in FIG. 6B, and therefore $1/B^2$ is 0.338 and the TTA emission ratio is 33.8%.

The organic light emitting element of this example is a white light emitting element having a blue light emitting material, a green light emitting material, and a red light emitting material. Therefore, optical interference filters having peak wavelengths of transmitted light of 460 nm, 560 nm, and 640 nm were individually disposed between the organic light emitting element and the photomultiplier, and the TTA emission ratio of the emissions derived from the blue light emitting material, the green light emitting material, and the red light emitting material were individually measured.

The TTA emission ratio of the emission derived from the blue light emitting material was 8%. The TTA emission ratio of the emission derived from the green light emitting material was 18%. The IA emission ratio of the emission derived from the red light emitting material was 37%. In particular, the TTA emission ratio of the emission derived from the red light emitting material was good. It is considered that the fact that the TTA ratio of the emission derived from the blue light emitting material is lower than that of G and R is the proof that triplet excitons efficiently move from the first light emitting layer to the second light emitting layer, and thus a long continuous drive lifetime can be achieved.

Examples 2 to 4, Comparative Examples 1 and 2, Reference Example

Organic white light emitting elements of Examples 2 and 4 and Comparative Examples 1 and 2 and a Reference Example were created in the same manner as in Example 1 except changing the weight ratio of the red light emitting material which is the first dopant of Example 1 as appropriate. The obtained organic light emitting elements were measured and evaluated for the characteristics in the same manner as in Example 1. The results are given in Table 2.

A case where the TTA emission ratio derived from the red light emitting material is 38% or more is expressed by A. A case where the TTA emission ratio is 35% or more and less than 38% is expressed by B. A case where the TTA emission ratio is 31% or more and less than 35% is expressed by C. A case where the TTA emission ratio is 27% or more and less than 31% is expressed by D. A case where the TTA emission ratio is less than 27% is expressed by E.

A case where the Δu'v' is less than 0.06 is expressed by A. A case where the Δu'v' is 0.06 or more and less than 0.07 is expressed by B. A case where the Δu'v' is 0.07 or more and less than 0.08 is expressed by C. A case where the Δu'v' is 0.08 or more and less than 0.09 is expressed by D. A case where the Δu'v' is 0.09 or more is expressed by E.

TABLE 2

| | First dopant (Red emission material) Mass % concentration | TTA emission ratio (derived from red emission material) | Chromaticity Δu' v' |
|---|---|---|---|
| Comp. Ex. 1 | 0.7% | E | B |
| Comp. Ex. 2 | 0.5% | D | A |
| Ex. 1 | 0.3% | B | A |
| Ex. 2 | 0.2% | A | A |
| Ex. 3 | 0.1% | A | A |
| Ex. 4 | 0.05% | A | B |
| Ref. Ex. | 0.02% | A | E |

In all the organic light emitting elements of Examples 1 to 4, Comparative Examples 1 and 2, and the Reference Example, the TTA emission ratio derived from the blue light emitting material was approximately 7% to 9% and the TTA emission ratio derived from the green light emitting material was approximately 17% to 19%, which were substantially equal to each other. On the other hand, when the red light emitting material which is the first dopant is 0.3 wt % or less, the TTA emission ratio derived from the red light emitting material is higher than that in the case where the red light emitting material which is the first dopant is 0.5 wt % or more, which shows that the TTA satisfactorily occurs.

However, the organic light emitting element of the Reference Example in which the first dopant is less than 0.05 wt %, the emission intensity derived from the red light emitting material decreased. When the red light emission luminance is taken into consideration, the weight ratio of the first dopant is preferably 0.05 wt % or more and 0.3 wt % or less when the weight of the first light emitting layer is set to 100 wt %.

Moreover, when the organic light emitting elements of Examples 1 to 4 which had good TTA emission ratios and were able to display good white color were also subjected to the continuous drive test at the initial luminance of 4000 cd/m², the luminance half time was 2500 to 3500 h, and thus the durability characteristic was also good.

The results of Examples 1 to 4 and Comparative Examples 1 and 2 show that the first dopant concentration is particularly preferably 0.1% or more and 0.2% or less. Thus, an organic light emitting element particularly excellent in the TTA emission ratio and white color display can be obtained.

Examples 5 to 10, Comparative Examples 3 to 8

Organic white light emitting elements of Examples 5 to 10 and Comparative Examples 3 to 8 were produced in the same manner as in Example 1 except changing the materials and the weight ratios of the hole transport layer, the electron blocking layer, the hole blocking layer, the electron transport layer, the first host, the second host, the first dopant, the second dopant, and the third dopant of Example 1 as appropriate. The obtained organic light emitting elements were measured and evaluated for the characteristics in the same manner as in Example 1. The results are given in Table 3. A case where the TTA emission ratio derived from the red light emitting material is 38% or more is expressed by A. A case where the TTA emission ratio is 35% or more and less than 38% is expressed by B. A case where the TTA emission ratio is 31% or more and less than 35% is expressed by C. A case where the TA emission ratio is 27% or more and less than 31% is expressed by D. A case where the TTA emission ratio is less than 27% is expressed by E. Moreover, a case where the luminance half time is 3000 h or more is expressed by A. A case where the luminance half time is 2000 h or more and less than 3000 h is expressed by B. A case where the luminance half time is less than 2000 h is expressed by C.

TABLE 3

| | HTL | EBL | HBL | ETL | First host | Second host | Second dopant (Blue light emitting material) | | First dopant (Red light emitting material) | | Third dopant (Green light emitting material) | | TTA emission ratio (derived from red light emitting material) | Half-life time |
|---|---|---|---|---|---|---|---|---|---|---|---|---|---|---|
| | | | | | | | Material | Mass % concentration | Material | Mass % concentration | Material | Mass % concentration | | |
| Ex. 5 | HT2 | HT8 | ET13 | ET2 | EM1 | EM1 | BD24 | 0.6 | RD11 | 0.3 | GD16 | 2 | B | A |
| Comp. Ex. 3 | HT2 | HT8 | ET13 | ET2 | EM1 | EM1 | BD24 | 0.6 | RD11 | 0.5 | GD16 | 2 | D | A |
| Ex. 6 | HT2 | HT8 | ET13 | ET2 | EM1 | EM1 | BD24 | 1 | RD11 | 0.3 | GD16 | 1 | B | A |
| Comp. Ex. 4 | HT2 | HT8 | ET13 | ET2 | EM1 | EM1 | BD24 | 1 | RD11 | 0.5 | GD16 | 1 | D | A |
| Ex. 7 | HT2 | HT8 | ET13 | ET2 | EM1 | EM1 | BD24 | 0.6 | RD1 | 0.3 | GD16 | 2 | A | B |
| Comp. Ex. 5 | HT2 | HT8 | ET13 | ET2 | EM1 | EM1 | BD24 | 0.6 | RD1 | 0.5 | GD16 | 2 | C | B |
| Ex. 8 | HT1 | HT9 | ET20 | ET3 | EM1 | EM1 | BD14 | 0.6 | RD11 | 0.3 | GD16 | 2 | B | A |
| Comp. Ex. 6 | HT1 | HT9 | ET20 | ET3 | EM1 | EM1 | BD14 | 0.6 | RD11 | 0.5 | GD16 | 2 | D | A |
| Ex. 9 | HT2 | HT9 | ET20 | ET3 | EM1 | EM5 | BD14 | 0.6 | RD11 | 0.3 | GD16 | 2 | A | A |
| Comp. Ex. 7 | HT2 | HT9 | ET20 | ET3 | EM1 | EM5 | BD14 | 0.6 | RD11 | 0.5 | GD16 | 2 | C | A |
| Ex. 10 | HT2 | HT9 | ET20 | ET3 | EM1 | EM5 | BD24 | 0.6 | RD11 | 0.3 | GD6 | 2 | A | B |
| Comp. Ex. 8 | HT2 | HT9 | ET20 | ET3 | EM1 | EM5 | BD24 | 0.6 | RD11 | 0.5 | GD6 | 2 | C | B |

While the weight ratio of the red light emitting material which is the first dopant is 0.3 wt % in the organic light emitting elements of Examples 5 to 10, the weight ratio of the red light emitting material which is the first dopant is 0.5 wt % in the organic light emitting elements of Comparative Examples 3 to 8. In all the organic light emitting elements of Examples 5 to 10 and Comparative Examples 3 to 8, the TTA emission ratio derived from the blue light emitting material was approximately 7% to 9% and the TTA emission ratio derived from the green light emitting material was approximately 17% to 19%, which were substantially equivalent to each other.

On the other hand, when the red light emitting material which is the first dopant is 0.3 wt % or less, the TTA emission ratio derived from the red light emitting material is higher than that in the case where the red light emitting material which is the first dopant is 0.5 wt % or more, which shows that the TTA satisfactorily occurs.

All the organic light emitting elements of Examples 5 to 10 and Comparative Examples 3 to 8 have good luminance half-life time.

However, it is considered that the luminance half-life time of the organic light emitting elements of Examples 7 and 10 is inferior to that of the organic light emitting elements of Examples 5, 6, 8, and 9 because the first dopant material RD1 or the third dopant material GD6 is a compound other than hydrocarbon compounds.

The values of the lowest singlet excitation energy and the lowest triplet excitation energy of each material used for the light emitting layers are given in Table 4.

TABLE 4

| | Lowest singlet excitation energy (eV) | Lowest triplet excitation energy (eV) |
|---|---|---|
| EM1 | 3.15 | 2.04 |
| EM3 | 3.24 | 2.03 |
| EM5 | 3.14 | 1.73 |
| BD24 | 2.98 | 2.15 |
| BD14 | 2.87 | 2.20 |
| RD11 | 2.18 | 1.26 |
| RD1 | 2.45 | 1.42 |
| RD13 | 2.03 | 1.24 |
| GD16 | 2.58 | 1.79 |
| GD6 | 2.49 | 1.66 |

Comparative Example 9

An organic white light emitting element was created in the same manner as in Example 1 except inserting 5 nm HT7 as an intermediate layer between the first light emitting layer and the second light emitting layer of Example 1. As a result of measuring and evaluating the characteristics in the same manner as in Example 1, the luminance half time was 1600 h, which sharply decreased as compared with Example 1.

The lowest triplet excitation energy of the HT7 obtained by the same calculation technique as that of Example 1 was 2.69 eV, which was higher than the triplet excitation energy of 2.04 eV of the EMI which is the first host and is the second host. Therefore, it is considered that the movement path of the triplet excitons from the first light emitting layer to the second light emitting layer was blocked by the intermediate layer, and therefore the triplet excitons are caused to stay in the first light emitting layer, and thus material deterioration is likely to occur.

Comparative Example 10

An organic light emitting element was produced in the same manner as in Example 1 except changing the configurations of the first light emitting layer and the second light emitting layer of Example 1 as follows. The first light emitting layer was configured so as to contain 99.1 wt % of EMI as the first host, 0.3 wt % of the red light emitting material RD21 as the first dopant, and 0.6 wt % of the blue light emitting material BD24 as the second dopant. The second light emitting layer 5 was configured so as to contain 98.0 wt % of the EM1 as the second host and 2.0 wt % of the green light emitting material GD11 as the third dopant. More specifically, the configuration is the configuration in which the first dopant and the second dopant are contained in the same layer. As a result of measuring and evaluating the characteristics in the same manner as in Example 1, the luminance half time was 1700 h, which sharply decreased as compared with Example 1.

This is considered to be because the triplet excitons are trapped by the first light emitting layer, and therefore the triplet excitons are caused to stay in the first light emitting layer, so that the concentration of the excitons of the first light emitting layer in which the second dopant is present does not relatively decrease, and therefore material deterioration is likely to occur.

Reference Example 2

An organic light emitting element of the configuration of FIG. 1A was produced. The host and dopant materials of the first light emitting layer are as in the following table 5. The dopant weight ratio was set to 0.6 wt %.

It was confirmed that, when the dopant concentration was larger than 0.3 wt %, the triplet excitons were likely to be localized in the dopant material when a barrier of the lowest triplet excitation energy from the dopant to the host was 0.3 eV or more, and therefore the TTA became difficult to occur.

The lowest triplet excitation energy T1(H) of the host of each organic light emitting element and the lowest triplet excitation energy T1(D) of the dopant were calculated by the same calculation technique as that of Example 1, and then ΔT1 was obtained by the following expression (8).

$$\Delta T1 = T1(H) - T1(D) \tag{8}$$

Moreover, the TTA emission ratio of each organic light emitting element was measured in the same manner as in Example 1 except not extracting a desired wavelength by an optical interference filter because it is a single color element.

The results above are given in Table 5. A case where the TTA emission ratio is 30% or more is expressed by A. A case where the TTA emission ratio is 25% or more and less than 30% is expressed by B. A case where the TTA emission ratio is 20% or more and less than 25% is expressed by C. A case where the TTA emission ratio is 15% or more and less than 20% is expressed by D. A case where the TTA emission ratio is 10% or more and less than 15% is expressed by E. A case where the TTA emission ratio is less than 10% is expressed by F. It was able to be confirmed from the above that, when the dopant concentration was larger than 0.3 wt %, the TA became difficult to occur when the barrier of the lowest triplet excitation energy from the dopant to the host was 0.3 eV or more.

TABLE 5

| | Host | Dopant | ΔT1 (eV) | TTA emission ratio |
|---|---|---|---|---|
| D1 | EM1 | RD13 | 0.8 | F |
| D2 | EM5 | RD13 | 0.49 | F |
| D3 | EM5 | RD1 | 0.33 | E |
| D4 | EM1 | GD16 | 0.25 | B |
| D5 | EM5 | GD6 | 0.07 | A |

Example 11

An organic light emitting element was produced in the same manner as in Example 2 except changing the first dopant material to the RD20.

Example 12

An organic light emitting element was produced in the same manner as in Example 11 except changing the second dopant material to the GD29.

Example 13

An organic light emitting element was produced in the same manner as in Example 12 except changing the third dopant material to the BD23.

Example 14

An organic light emitting element was produced in the same manner as in Example 13 except changing the HTL material to the HT3.

Example 15

An organic light emitting element was produced in the same manner as in Example 14 except changing the ETL material to the ET7.

Example 16

An organic light emitting element was produced in the same manner as in Example 15 except changing the EBL material to the HT10.

Example 17

An organic light emitting element was produced in the same manner as in Example 16 except changing the HBL material to the ET12.

Example 18

An organic light emitting element was produced in the same manner as in Example 17 except changing the phenyl group which is a substituent of the ET12 to a naphthyl group.

Example 19

An organic light emitting element was produced in the same manner as in Example 18 except changing the EBL to a mixed layer of the HT10 and the HT3.

Example 20

An organic light emitting element was produced in the same manner as in Example 18 except changing the EBL to contain a mixed layer of the HT2 and the HT3.

Example 21

An organic light emitting element was produced in the same manner as in Example 20 except setting the HIL film thickness to 8.4 nm, the HTL film thickness to 8.0 nm, the EBL film thickness to 10.0 nm, the film thickness of the first light emitting layer to 20.4 nm, the film thickness of the second light emitting layer to 9.2 nm, the HBL film thickness to 80 nm, the ETL film thickness to 30 nm, and the LiF film thickness to 0.45 nm.

Example 22

An organic light emitting element was produced in the same manner as in Example 20 except setting the HIL film thickness to 3.0 nm, the HTL film thickness to 11.0 nm, the EBL film thickness to 12.0 nm, the film thickness of the first light emitting layer to 17.4 nm, the film thickness of the second light emitting layer to 10.8 nm, the HBL film thickness to 100 nm, the ETL film thickness to 32 nm, and the LiF film thickness to 0.45 nm.

Example 23

An organic light emitting element was produced in the same manner as in Example 19 except setting the HIL film thickness to 3.0 nm, the HTL film thickness to 8.0 nm, the EBL film thickness to 10.0 nm, the film thickness of the first light emitting layer to 20.4 nm, the film thickness of the second light emitting layer to 9.2 nm, the HBL film thickness to 80 nm, the ETL film thickness to 30 nm, and the LiF film thickness to 0.45 nm.

Example 24

An organic light emitting element was produced in the same manner as in Example 19 except setting the HIL film thickness to 8.4 nm, the HTL film thickness to 5.5 nm, the EBL film thickness to 9.5 nm, the film thickness of the first light emitting layer to 17.2 nm, the film thickness of the second light emitting layer to 8.6 nm, the HBL film thickness to 110 nm, the ETL film thickness to 32 nm, and the LiF film thickness to 0.45 nm.

Example 25

An organic light emitting element was produced in the same manner as in Example 19 except setting the HIL film thickness to 8.4 nm, the HTL film thickness to 5.5 nm, the EBL film thickness to 12.0 nm, the film thickness of the first light emitting layer to 20.4 nm, the film thickness of the second light emitting layer to 5.0 nm, the HBL film thickness to 80 nm, the ETL film thickness to 26 nm, and the LiF film thickness to 0.45 nm.

Example 26

An organic light emitting element was produced in the same manner as in Example 24 except setting the mixing ratio of the HT10 and the HT3 in the EBL to 1:2.

Example 27

An organic light emitting element was produced in the same manner as in Example 24 except setting the mixing ratio of the HT10 and the HT3 in the EBL to 1:3.

Example 28

An organic light emitting element was produced in the same manner as in Example 21 except setting the mixing ratio of the HT2 and the HT3 in the EBL to 1:2.

Example 29

An organic light emitting element was produced in the same manner as in Example 21 except setting the mixing ratio of the HT2 and the HT3 in the EBL to 1:3.

It was confirmed also in Example 11 to Example 29 that the TTA efficiency is high and the drive lifetime is long similarly to Examples 1 to 10.

As described above, the organic light emitting element according to one embodiment of the present invention is an organic light emitting element having high emission efficiency and a long drive lifetime.

The present invention can provide an organic light emitting element having high emission efficiency and a long drive lifetime.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2018-068577 filed Mar. 30, 2018 and 2018-210725 filed Nov. 8, 2018, which are hereby incorporated by reference herein in their entirety.

What is claimed is:

1. An organic light emitting element comprising:
a first electrode;
a first light emitting layer;
a second light emitting layer; and
a second electrode, in this order,
wherein:
the first light emitting layer includes a first host material and a first dopant material,
the second light emitting layer includes a second host material and a second dopant material;
a lowest triplet excitation energy of the first host material is higher than a lowest triplet excitation energy of the first dopant material,
an energy gap of the second dopant material is larger than an energy gap of the first dopant material, and
when a weight sum of the first host material and the first dopant material is set to 100 wt %, a concentration of the first dopant material is 0.3 wt % or less.

2. The organic light emitting element according to claim 1, wherein
the first dopant material is a fluorescent light emitting material.

3. The organic light emitting element according to claim 1, wherein
a difference between the lowest triplet excitation energy of the first host material and the lowest triplet excitation energy of the first dopant material is 0.3 eV or less.

4. The organic light emitting element according to claim 1, wherein
a lowest triplet excitation energy of a first organic compound layer contained in a region from the first light emitting layer to the second light emitting layer is equal to or less than a lowest triplet excitation energy of a second organic compound layer adjacent on a side of the second electrode to the first organic compound layer.

5. The organic light emitting element according to claim 1, wherein
a lowest triplet excitation energy of the second host material is higher than the lowest triplet excitation energy of the first host material.

6. The organic light emitting element according to claim 1, wherein
a lowest triplet excitation energy of the second host material is lower than a lowest triplet excitation energy of the second dopant material.

7. The organic light emitting element according to claim 1, wherein
in a material contained in the first light emitting layer and a material contained in the second light emitting layer, a difference between a lowest singlet excitation energy and a lowest triplet excitation energy is 0.2 eV or more.

8. The organic light emitting element according to claim 1, wherein
the first host material and the second host material are identical.

9. The organic light emitting element according to claim 1, wherein
the first light emitting layer and the second light emitting layer are in contact with each other.

10. The organic light emitting element according to claim 1 further comprising:
an intermediate layer disposed between the first light emitting layer and the second light emitting layer, wherein
a lowest triplet excitation energy $T1(HM)$ of the intermediate layer is equal to or less than a lowest triplet excitation energy of the second host material and equal to or more than the lowest triplet excitation energy of the first host material.

11. The organic light emitting element according to claim 1, wherein
the first light emitting layer and the second light emitting layer are light emitting layers emitting white color by the first light emitting layer and the second light emitting layer, and
the organic light emitting element has a color filter on a light emitting side.

12. The organic light emitting element according to claim 1, wherein
the first light emitting layer further includes a third dopant material, and
a lowest triplet excitation energy $T1(H1)$ of the first host material and a lowest triplet excitation energy $T1(D3)$ of the third dopant material satisfy the following expression (4), $$0\ eV < T1(H1) - T1(D3) < 0.3\ eV \qquad (4).$$

13. The organic light emitting element according to claim 1, wherein
when the weight sum of the first host material and the first dopant material is set to 100 wt %, a weight ratio of the first dopant material is 0.05 wt % or more and 0.3 wt % or less.

14. The organic light emitting element according to claim 1, wherein
the first host material is a low molecular organic compound.

15. A display apparatus comprising:
a plurality of pixels, wherein
each of the pixels includes the organic light emitting element according to claim 1 and an active element connected to the organic light emitting element.

16. An image pickup apparatus comprising:
an optical section having a plurality of lenses;
an image pickup element receiving light passing through the optical section; and a display section displaying an image, wherein
the display section is a display section displaying an image picked up by the image pickup element, and
the display section includes the organic light emitting element according to claim 1.

17. Electronic equipment comprising:
a display section including the organic light emitting element according to claim 1;
a housing in which the display section is provided; and
a communication section provided in the housing.

18. An illumination apparatus comprising:
a light source including the organic light emitting element according to claim 1; and
a light diffusion section or an optical film transmitting light emitting by the light source.

19. A moving body comprising:
a lighting tool including the organic light emitting element according to claim 1, and
a body in which the lighting tool is provided.

20. The organic light emitting element according to claim 1,
wherein the first dopant material is a light emitting material and the second dopant material is a light emitting material;
and wherein an emission wavelength of the first dopant material is longer than an emission wavelength of the second dopant material.

* * * * *